(12) United States Patent
Takagi et al.

(10) Patent No.: US 6,753,615 B2
(45) Date of Patent: Jun. 22, 2004

(54) OPTICAL ELEMENT MODULE

(75) Inventors: Shinichi Takagi, Tokyo (JP); Hiroshi Aruga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 14 days.

(21) Appl. No.: 10/229,118

(22) Filed: Aug. 28, 2002

(65) Prior Publication Data

US 2003/0098507 A1 May 29, 2003

(30) Foreign Application Priority Data

Nov. 29, 2001 (JP) ........................................ 2001-364450

(51) Int. Cl.[7] .............................................. H01L 23/48
(52) U.S. Cl. ...................... 257/784; 257/737; 257/678; 257/684; 257/688; 257/728; 257/734
(58) Field of Search ................................ 257/737, 678, 257/684, 688, 728, 734, 784; 385/90, 91, 93, 94

(56) References Cited

U.S. PATENT DOCUMENTS

| | | | | |
|---|---|---|---|---|
| 5,132,532 | A | * | 7/1992 | Watanabe .................... 250/239 |
| 5,610,395 | A | * | 3/1997 | Nishiyama ................... 250/239 |
| 5,744,848 | A | * | 4/1998 | Harazono ..................... 257/433 |
| 6,227,724 | B1 | * | 5/2001 | Verdiell ......................... 385/91 |
| 6,323,986 | B1 | | 11/2001 | Lee et al. |
| 6,404,042 | B1 | * | 6/2002 | Sone et al. .................. 257/678 |
| 6,586,726 | B2 | * | 7/2003 | Verdiell ....................... 250/239 |
| 2001/0024461 | A1 | | 9/2001 | Nakata |

FOREIGN PATENT DOCUMENTS

| | | |
|---|---|---|
| EP | 0 632 550 A2 | 1/1995 |
| EP | 0 987 802 A2 | 3/2000 |
| JP | 63-104391 A | 5/1988 |
| JP | 6-334000 A | 12/1994 |
| JP | HEI11-288961 A | 10/1999 |

\* cited by examiner

*Primary Examiner*—Michael S. Lebentritt
*Assistant Examiner*—Douglas Menz
(74) *Attorney, Agent, or Firm*—Burns, Doane, Swecker & Mathis, L.L.P.

(57) ABSTRACT

In a conventional optical element module, a filter substrate mounting an air-core coil thereto is mounted in the vicinity of a light emitting element, and the light emitting element and the air-core coil are electrically connected to each other by a bonding wire, etc. Therefore, a problem exists in that it is difficult to set the length of a line path between the light emitting element and the air-core coil to about 1 mm or less, and no preferable high frequency characteristics are obtained. Therefore, an optical element module of this invention has a light emitting element, and a filter portion used in one portion of a bias circuit for supplying a bias electric current from a power source to this light emitting element, wherein this filter portion has a coil portion and a first connecting portion extending from one end of this coil portion, and the first connecting portion directly connects the coil portion and the light emitting element without electrically joining the first connecting portion to any substrate on the way.

20 Claims, 21 Drawing Sheets

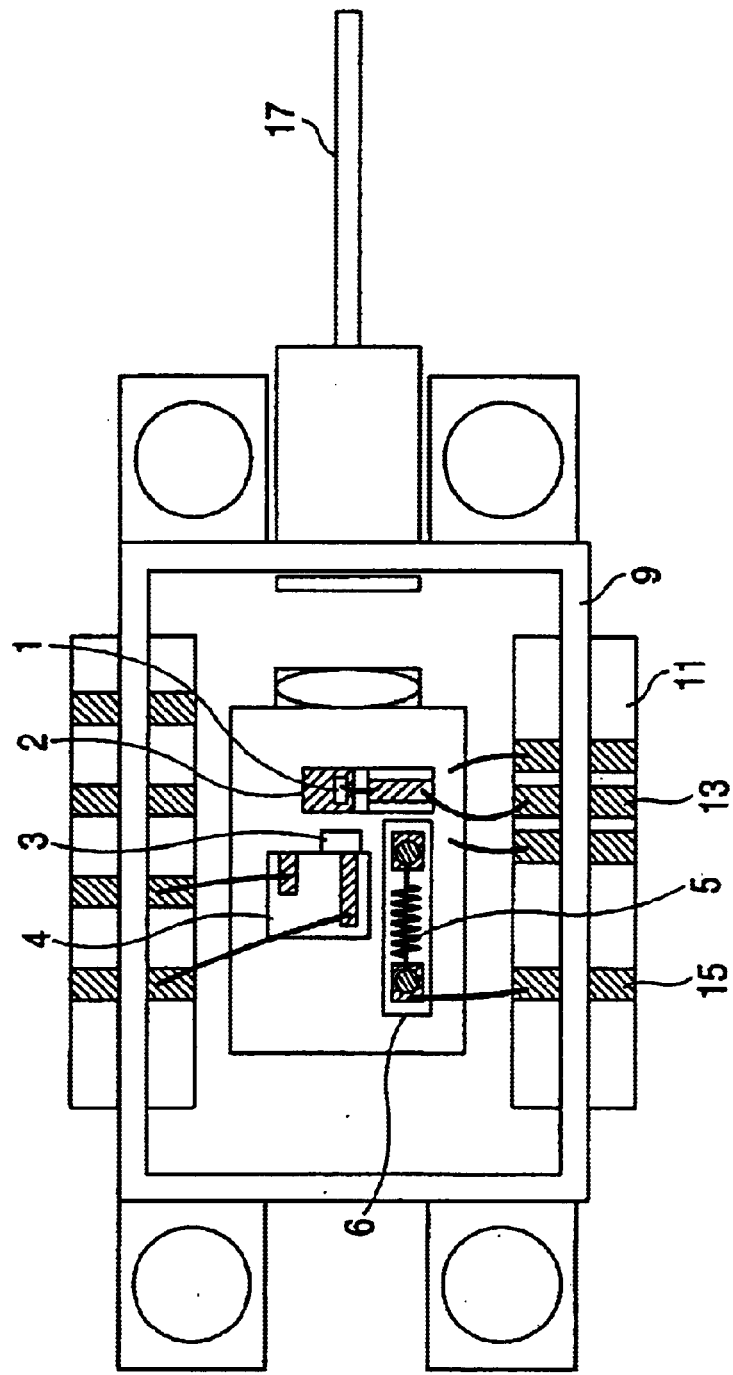
FIG. 28 CONVENTIONAL

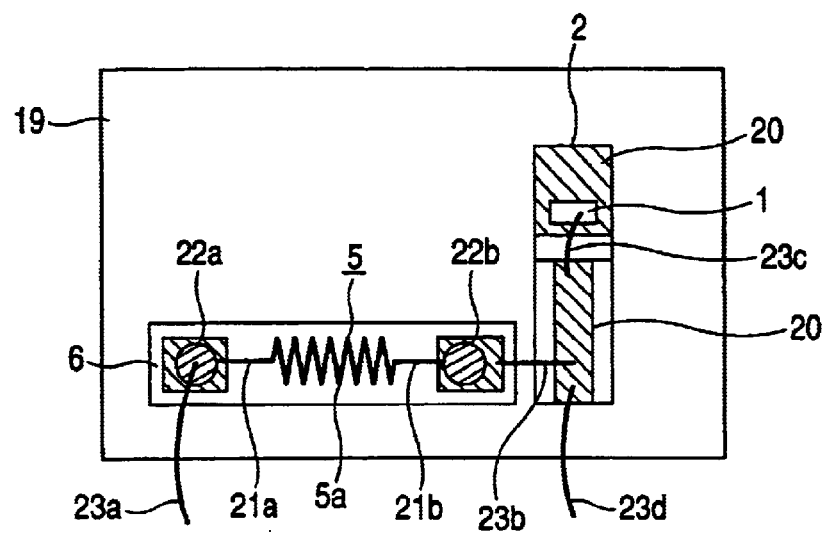
FIG. 29 CONVENTIONAL
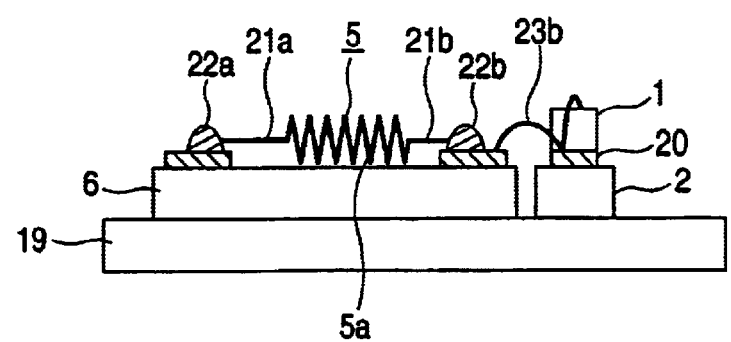
FIG. 30 CONVENTIONAL

OPTICAL ELEMENT MODULE

BACKGROUND OF THE INVENTION

1. Field of the Invention

This invention relates to an optical element module having a coil in a bias circuit for supplying power.

2. Description of the Related Art

FIG. 28 is a top view showing a structural example of a conventional optical element module. In FIG. 28, reference numerals 1, 2, and 3 respectively designate a light emitting element for converting an electric signal and an optical signal, a light emitting element carrier as a substrate for mounting this light emitting element 1 and manufactured by aluminum nitride, and a light receiving element for monitoring a rear face output from the light emitting element 1. Reference numerals 4, 5, and 6 respectively designate a light receiving element carrier for mounting this light receiving element 3, a filter, and a filter substrate for mounting this filter 5. Reference numerals 9, 11, and 13 respectively designate a package for airtightly sealing the light emitting element 1, etc., a feed-through having a coplanar or a microstrip line, etc. for electrically conducting the interior and the exterior of this package 9, and an electrode for high frequency arranged in this feed-through 11 and supplying an RF signal to the light emitting element 1. Reference numerals 15, and 17 respectively designate an electrode for bias arranged in the feed-through 11 and supplying a bias electric current from an unillustrated power source to the light emitting element 1, and an optical fiber for transmitting the optical signal.

FIG. 29 is a top view of a main portion of the conventional optical element module shown in FIG. 28. FIG. 30 is a side view of the main portion shown in FIG. 29. In these figures, reference numerals 19, 20, and 5a respectively designate a base carrier for placing the light emitting element carrier 2 and the light receiving element carrier 4, a pattern formed on the light emitting element carrier 2, and an air-core coil as a central portion of the filter 5. Reference numerals 21a and 21b designate connecting portions extending from one end and the other end of this air-core coil 5a. The filter 5 is constructed by this air-core coil 5a and the connecting portions 21a and 21b. Reference numerals 22a and 22b respectively designate solder joining portions for soldering and joining the connecting portions 21a and 21b to the filter substrate 6. Reference numeral 23a designates a bonding wire for making an electrical connection between the electrode 15 for bias and the solder joining portion 22a. Reference numeral 23b designates a bonding wire for making an electrical connection between the solder joining portion 22b and the pattern 20. Reference numeral 23c designates a bonding wire for making an electrical connection between the pattern 20 and the light emitting element 1. Reference numeral 23d designates a bonding wire for making an electrical connection between the pattern 20 and the electrode for high frequency.

The conventional optical element module is constructed as mentioned above. An RF signal transmitted from an unillustrated driver IC is inputted to the light emitting element 1 via the electrode 13 for high frequency, the bonding wire 23d, the pattern 20 and the bonding wire 23c. A direct current (DC) for supplying the bias electric current from the power source to the light emitting element 1 is inputted to the light emitting element 1 via the electrode 15 for bias, the bonding wire 23a, the solder joining portion 22a, the connecting portion 21a, the air-core coil 5a, the connecting portion 21b, the solder joining portion 22b, the bonding wire 23b, the pattern 20 and the bonding wire 23c.

Namely, a bias circuit for supplying power is generally arranged in the optical element module in addition to a circuit for supplying the RF signal. The air-core coil 5a is a noise countermeasure part used in this bias circuit, and functions as a filter for preventing the RF signal from being transmitted to the bias circuit. The air-core coil 5a is widely used as a part for the bias circuit for the following reasons, etc. Namely, (1) compactness can be realized by a precise winding technique, (2) the electric current flowing through the air-core coil 5a can be increased since the air-core coil 5a has low direct current resistance, and (3) the RF signal can be prevented in a wide band since parasitic capacity is small and self resonance frequency is high.

On the other hand, a high speed operation of the optical element module is required to cope with an increase in transmission capacity. Recently, the optical element module of 10 Gbps or more is required instead of the conventional optical element module of 2.5 Gbps.

Here, when the length of a line path (the total of lengths of the connecting portion 21b, the solder joining portion 22b, the bonding wire 23b, the pattern 20 and the bonding wire 23c) between the light emitting element 1 and the bias circuit (the air-core coil 5a in this case) is longer than ¼ of an upper limit frequency wavelength in a passing band, the resonance frequency of the line path itself between the light emitting element 1 and the bias circuit lies within this passing band. Therefore, the passing band is limited by this resonance. It is necessary to set the line path length between the light emitting element 1 and one end of the air-core coil 5a to about 1 mm or less so as to cope with the recent high speed of 10 Gbps or more.

In the conventional optical element module, as mentioned above, the filter substrate 6 mounting the air-core coil 5a thereto is mounted in the vicinity of the light emitting element 1, and the light emitting element 1 and the air-core coil 5a are electrically connected to each other by the bonding wires 23b, 23c, etc. Therefore, a problem exists in that it is difficult to set the line path length between the light emitting element 1 and the air-core coil 5a to about 1 mm or less, and no preferable high frequency characteristics are obtained.

SUMMARY OF THE INVENTION

This invention is made to solve the above problem, and an object of this invention is to provide an optical element module able to obtain preferable high frequency characteristics by shortening the line path length between the light emitting element 1 and the air-core coil 5a.

An optical element module in this invention comprises alight emitting element; and a filter portion used in one portion of a bias circuit for supplying a bias electric current from a power source to this light emitting element; wherein this filter portion has a coil portion and a first connecting portion extending from one end of this coil portion; and the first connecting portion directly connects the coil portion and the light emitting element without electrically joining the first connecting portion to any substrate on the way.

In the optical element module in this invention, the coil portion and the light emitting element are connected to each other by thermocompression-bonding a one-side end portion of the first connecting portion to the light emitting element.

In the optical element module in this invention, the light emitting element has a metallic electrode on its surface, and a one-side end portion of the first connecting portion is constructed by forming a metallic film on a lead wire, and the coil portion and the light emitting element are connected to each other by joining the one-side end portion having the metallic film to the metallic electrode.

In the optical element module in this invention, the light emitting element has a metallic electrode on its surface, and the coil portion and the light emitting element are connected to each other by fixing a one-side end portion of the first connecting portion to this metallic electrode by a bump.

In the optical element module in this invention, the one-side end portion of the first connecting portion is constructed by forming a metallic film on a lead wire.

In the optical element module in this invention, the first connecting portion has a length shorter than ¼ of a wavelength corresponding to an upper limit frequency of a high frequency signal supplied to the light emitting element.

In the optical element module in this invention, the first connecting portion has a length of 1 mm or less.

In the optical element module in this invention, an optical element module comprises a package; a feed-through for electrically conducting the interior and the exterior of this package, and having a shelf portion projected to the interior; a light emitting element included within the package; and a filter portion used in one portion of a bias circuit for supplying a bias electric current from a power source to the light emitting element; wherein this filter portion has a coil portion and a first connecting portion extending from one end of this coil portion, and also has a second connecting portion extending from the other end of the coil portion; the first connecting portion directly connects the coil portion and the light emitting element without electrically joining the first connecting portion to any substrate on the way; and the second connecting portion directly connects the other end of the coil portion and the shelf portion of the feed-through without electrically joining the second connecting portion to any substrate on the way.

In the optical element module in this invention, a filter portion for low frequency is arranged in the shelf portion of the feed-through, and is electrically connected in series to the coil through the second connecting portion.

In the optical element module in this invention, the light emitting element has a gold electrode on its surface, and the filter portion is constructed by one copper wire, and an insulating film is formed on the coil portion, and a gold film is formed on a one-side end portion of the first connecting portion, and the coil portion and the light emitting element are connected to each other by joining the one-side end portion having this gold film to the gold electrode of the light emitting element.

In the optical element module in this invention, an optical element module comprises a light emitting element; a substrate mounting this light emitting element thereto; and a filter portion used in one portion of a bias circuit for supplying a bias electric current from a power source to the light emitting element; wherein this filter portion has a coil portion and a first connecting portion extending from one end of this coil portion; and the first connecting portion directly connects the coil portion and the substrate mounting the light emitting element thereto without electrically joining the first connecting portion to any substrate on the way.

In the optical element module in this invention, the coil portion and the substrate mounting the light emitting element thereto are connected to each other by thermocompression-bonding a one-side end portion of the first connecting portion to the substrate mounting the light emitting element thereto.

In the optical element module in this invention, the substrate mounting the light emitting element thereto has a metallic pattern on its surface, and a one-side end portion of the first connecting portion is constructed by forming a metallic film on a lead wire, and the coil portion and the substrate mounting the light emitting element thereto are connected to each other by joining the one-side end portion having the metallic film to the metallic pattern.

In the optical element module in this invention, the substrate mounting the light emitting element thereto has a metallic pattern on its surface, and the coil portion and the substrate mounting the light emitting element thereto are connected to each other by fixing a one-side end portion of the first connecting portion to this metallic pattern by a bump.

In the optical element module in this invention, the one-side end portion of the first connecting portion is constructed by forming a metallic film on a lead wire.

In the optical element module in this invention, the length of a line path from one end of the coil portion to the light emitting element is shorter than ¼ of a wavelength corresponding to an upper limit frequency of a high frequency signal supplied to the light emitting element.

In the optical element module in this invention, the length of a line path from one end of the coil portion to the light emitting element is set to 1 mm or less.

In the optical element module in this invention, an optical element module comprises a package; a feed-through for electrically conducting the interior and the exterior of this package, and having a shelf portion projected to the interior; a light emitting element included within the package; a substrate mounting this light emitting element thereto; and a filter portion used in one portion of a bias circuit for supplying a bias electric current from a power source to the light emitting element; wherein this filter portion has a coil portion and a first connecting portion extending from one end of this coil portion, and also has a second connecting portion extending from the other end of the coil portion; the first connecting portion directly connects the coil portion and the substrate mounting the light emitting element thereto without electrically joining the first connecting portion to any substrate on the way; and the second connecting portion directly connects the other end of the coil portion and the shelf portion of the feed-through without electrically joining the second connecting portion to any substrate on the way.

In the optical element module in this invention, a filter portion for low frequency is arranged in the shelf portion of the feed-through, and is electrically connected in series to the coil through the second connecting portion.

In the optical element module in this invention, the substrate mounting the light emitting element thereto has a gold pattern constructed by gold on its surface, and the filter portion is constructed by one copper wire, and an insulating film is formed on the coil portion, and a gold film is formed on a one-side end portion of the first connecting portion, and the coil portion and the substrate mounting the light emitting element thereto are connected to each other by joining the one-side end portion having this gold film to the gold pattern.

BRIEF DESCRIPTION OF THE DRAWINGS

FIG. 28 is a top view showing a structural example of a conventional optical element module.

FIG. 29 is a top view of a main portion of the conventional optical element module shown in FIG. 28.

FIG. 30 is a side view of the main portion shown in FIG. 29.

DESCRIPTION OF THE PREFERRED EMBODIMENTS

Embodiment Mode 1

Figure 1:
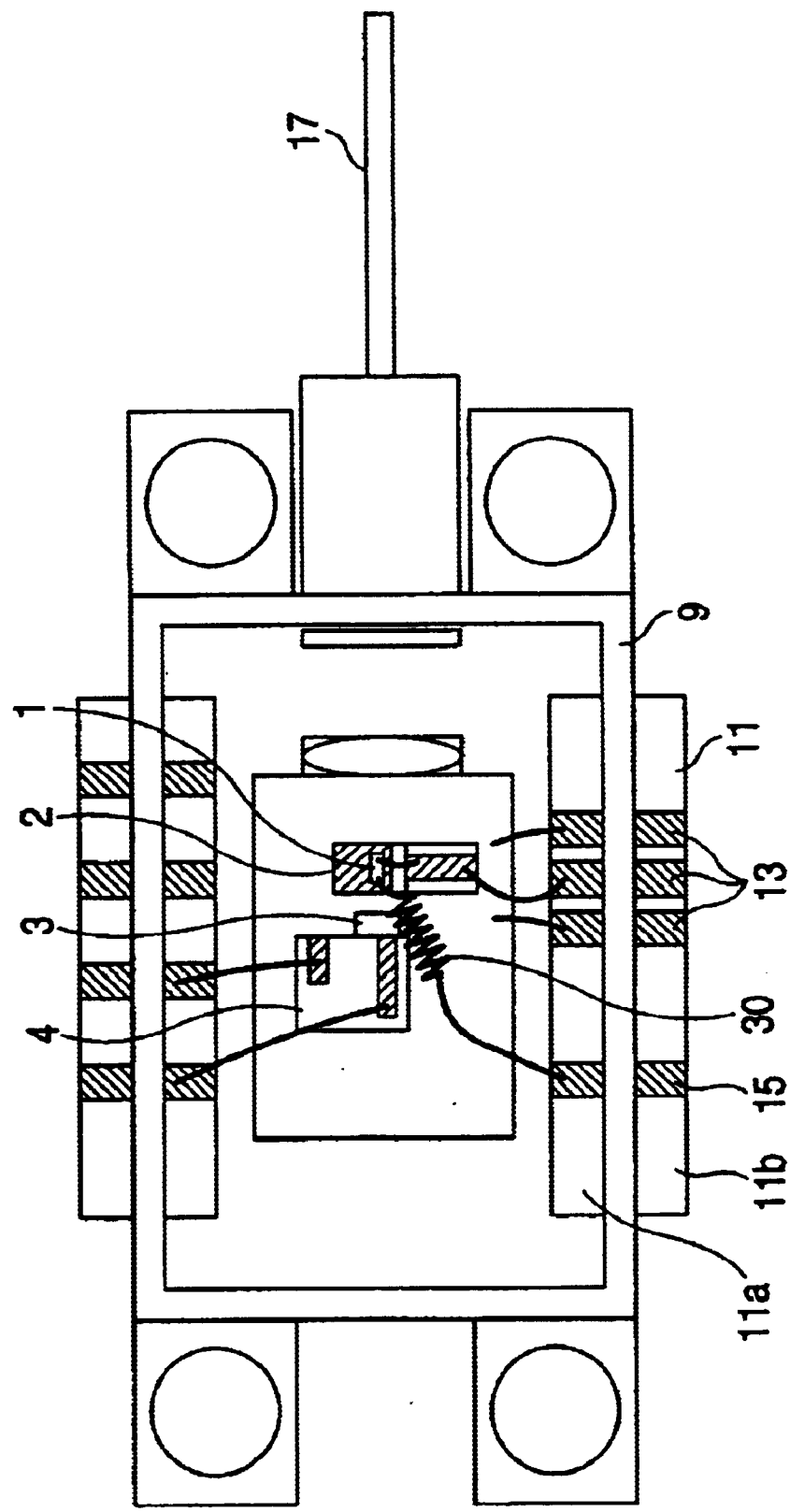
FIG. 1 is a top view showing the structure of an optical element module in accordance with an embodiment mode 1 of this invention.

FIG. 1 is a top view showing the structure of an optical element module in accordance with an embodiment mode 1 of this invention. In this figure, reference numerals 11a and 11b respectively designate a shelf portion constituting one portion of a feed-through 11 and projected inside from a side wall of a package 9, and a shelf portion projected outside from the side wall of the package 9. An electrode 15 for bias is formed on surfaces of the shelf portions 11a and 11b, and electrically conducts the interior and the exterior of the package 9 through the sidewall. Reference numeral 30 designates a filter portion used in one portion of a bias circuit for supplying a bias electric current from an unillustrated power source to a light emitting element 1. One end of this filter portion 30 is connected to the light emitting element 1, and the other is connected to the electrode 15 for bias on the surface of the shelf portion 11a of the feed-through 11. Namely, in the optical element module in this embodiment mode 1, the filter portion 30 is laid and arranged between the light emitting element 1 and the feed-through 11. Therefore, no substrate for mounting the filter portion 30 exists.

Figure 2:
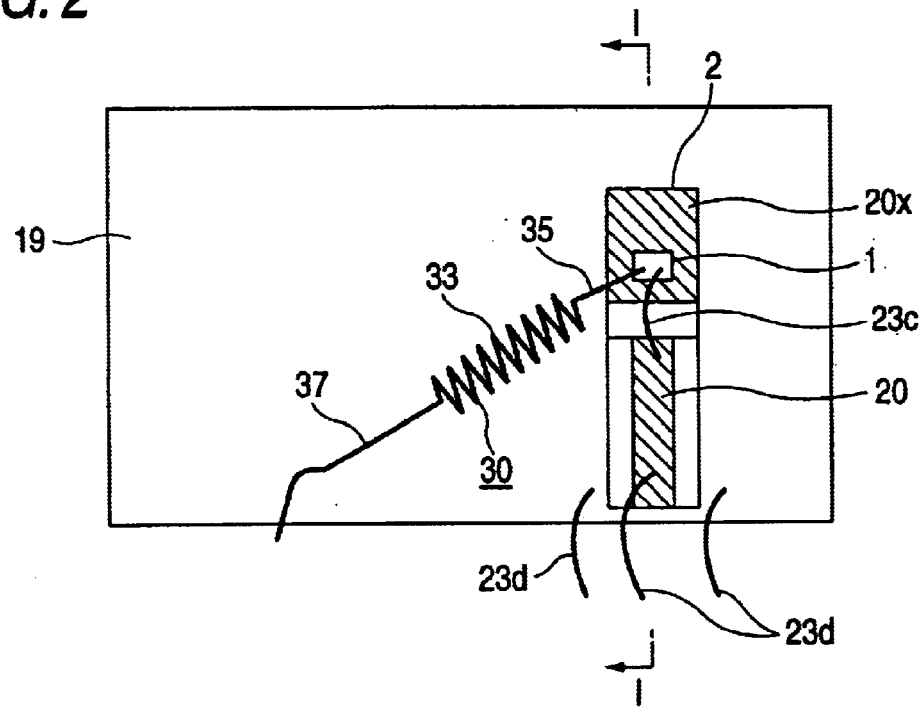
FIG. 2 is a top view of a main portion of the optical element module in accordance with the embodiment mode 1 shown in FIG. 1.
Figure 3:
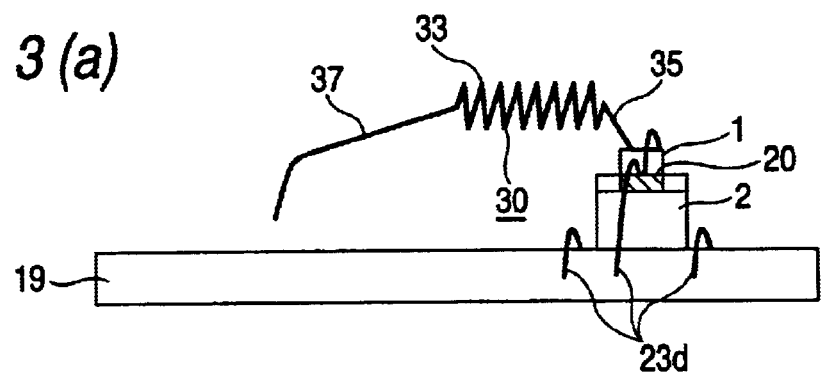
FIG. 3 is a side view of the main portion shown in FIG. 2.
Figure 3:
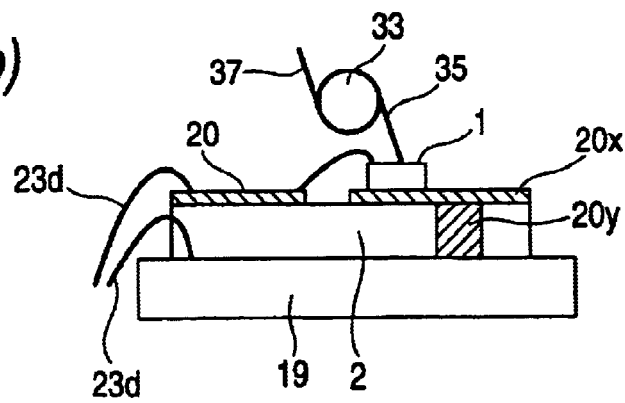

The construction of the filter portion 30 will next be explained in detail by using FIGS. 2 and 3. FIG. 2 is a top view of a main portion of the optical element module in accordance with the embodiment mode 1 shown in FIG. 1, and FIG. 3 is a side view of the main portion shown in FIG. 2. In FIG. 3, FIG. 3A is a side view showing a connecting situation of the filter portion 30 seen from a side of the feed-through 11, and FIG. 3B is a sectional view seen from a I—I section of FIG. 2.

In these figures, reference numerals 33, 35 and 37 respectively designate an air-core coil corresponding to a coil portion as a central portion of the filter portion 30, a first connecting portion extending from one end of this air-core coil 33, and a second connecting portion extending from the other end of the air-core coil 33. As mentioned above, no conventionally existing filter substrate 6 exists in this embodiment mode. Therefore, the first connecting portion 35 directly connects the air-core coil 33 and the light emitting element 1 without electrically joining the first connecting portion 35 to any substrate on the way. Here, "electrically" means that a mechanical connection may be also made. Namely, there is also a case in which the filter portion 30 is mechanically joined (held) to a base carrier 19, a light emitting element carrier 2, etc. by an adhesive, etc. This construction is set in consideration of a case in which the filter portion 30 is heavy in weight, etc. In this case, the filter portion 30 is mechanically joined to the base carrier 19, the light emitting element carrier 2, etc. in the air-core coil 33, or the first connecting portion 35 and the second connecting portion 37.

Similarly, the second connecting portion 37 directly connects the air-core coil 33 and the electrode 15 for bias arranged on the surface of the shelf portion 11a of the feed-through 11 without electrically joining the second connecting portion 37 to any substrate on the way.

Here, the first connecting portion 35, the air-core coil 33 and the second connecting portion 37 are formed by constructing the air-core coil 33 by forming a spiral in an intermediate portion of one copper wire. Namely, no filter portion 30 has a cutting face on the way except for both ends of this filter portion 30.

The first connecting portion 35 has a length shorter than ¼ of a wavelength corresponding to an upper limit frequency of a high frequency signal supplied to the light emitting element 1. Namely, this length is set to 1 mm or less in consideration of the case of a high speed of 10 Gbps or more.

The filter portion 30 is naturally arranged in an unobstructing position when back face light of the light emitting element 1 reaches a light receiving element 3.

In this embodiment mode, it is supposed that an electrode 13 for high frequency in the feed-through 11 forms a coplanar line path. In FIG. 3B, a pattern 20 is a strip-shaped conductor, and the light emitting element carrier 2 is a dielectric substrate, and the base carrier 19 is a plane conductor plate. Therefore, the pattern 20, the light emitting element carrier 2 and the base carrier 19 function as a microstrip line path. This microstrip line path is connected by the coplanar line path of the feed-through 11 and a bonding wire 23d. Reference numeral 20x designates a ground conductor interposed between the light emitting element 1 and the light emitting element carrier 2, and connected to the plane conductor 19 by a VIA hole 20y.

Figure 4:
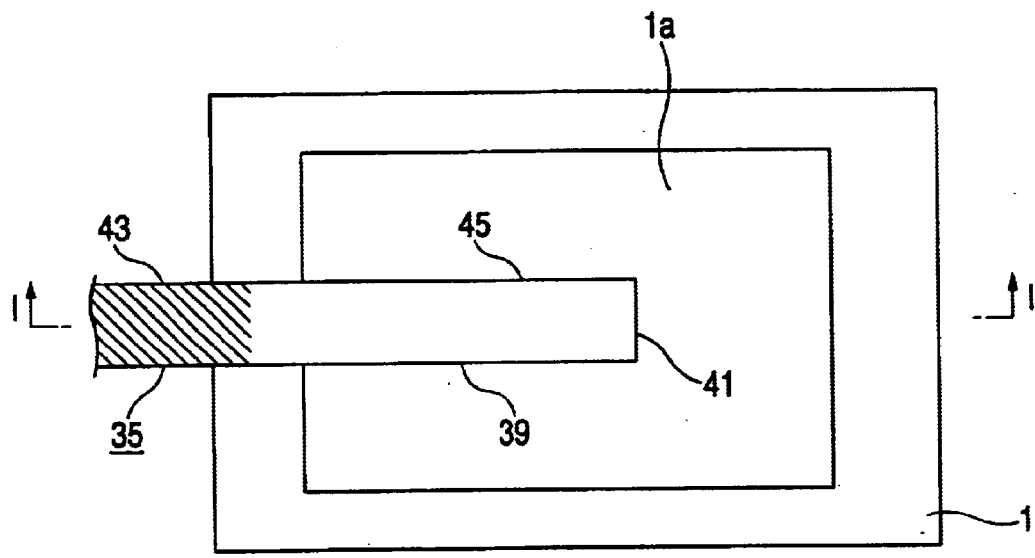
FIG. 4 is an enlarged view in which a joining portion of a light emitting element 1 and a first connecting portion 35 in FIG. 2 is seen from a top face.
Figure 5:
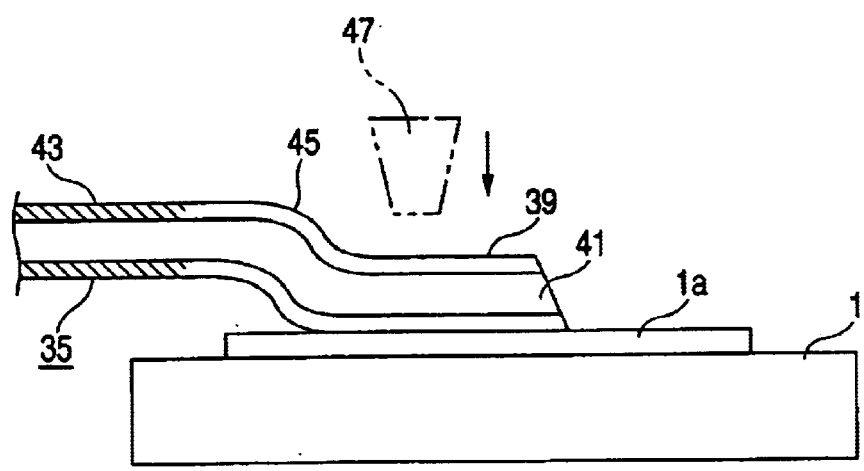
FIG. 5 is a sectional view in a I—I section of the joining portion shown in FIG. 4.

The relation of the first connecting portion 35 and the light emitting element 1 will be further explained by using FIGS. 4 and 5. FIG. 4 is an enlarged view in which a joining portion of the light emitting element 1 and the first connecting portion 35 in FIG. 2 is seen from a top face. FIG. 5 is a sectional view in a I—I section of the joining portion shown in FIG. 4.

In these figures, reference numerals 1a, 39 and 41 respectively designate a gold electrode as a metallic electrode formed on the surface of the light emitting element 1, a one-side end portion of the first connecting portion 35, and a copper wire as an example of a lead wire communicated over an entire length (the first connecting portion 35, the air-core coil 33 and the second connecting portion 37) of the filter portion 30 including this one-side end portion 39 without a cutting face. Reference numeral 43 designates an insulating film made by enamel and the copper wire 41 is coated with this insulating film 43. The insulating film 43 is formed in the air-core coil 33, one portion of the first connecting portion 35 and one portion of the second connecting portion 37. Reference numeral 45 designates gold plating as a metallic film formed on the copper wire 41 in a portion of the one-side end portion 39. Namely, the filter portion 30 has a construction having the air-core coil 33 between the first connecting portion 35 and the second connecting portion 37 by forming a spiral in an intermediate portion of the one copper wire 41 coated with the insulating film 43. Further, this filter portion 30 is constructed by removing at least the insulating film 43 on the surface of the one-side end portion 39 of the first connecting portion 35, and gold-plating the copper wire 41.

On the other hand, the one-side end portion 39 having the gold plating 45 is joined to the gold electrode 1a by thermocompression bonding using an instrument, etc. widely used as a device and a jig for wire bonding such as a capillary 47. The air-core coil 33 and the light emitting element 1 are connected to each other by the first connecting portion 35 by this joining. When a supersonic wave is used together, temperature of the thermocompression bonding is set to about 150° C.

Since the optical element module in this embodiment mode is constructed as mentioned above, it is possible to omit the solder joining portion 22b, the bonding wire 23b, the filter substrate 6, etc. conventionally arranged. Further, the light emitting element 1 and the air-core coil 33 can be directly joined to each other by the first connecting portion 35 without passing through the bonding wire 23c and the pattern 20. As a result, the distance between both the light emitting element 1 and the air-core coil 33 can be shortened. Therefore, it is possible to obtain an optical element module having preferable high frequency characteristics.

The filter portion 30 in this embodiment mode is formed by one copper wire 41 over the entire length of this filter portion 30, and is constructed by gold-plating the surface of the one-side end portion 39 of the first connecting portion 35. This is because it is considered that, when it is intended to form all of the first connecting portion 35 by gold wire, the first connecting portion 35 is too soft to form the air-core coil 33. In contrast to this, the copper wire 41 is a hard raw material in comparison with gold. Therefore, there is an effect of easily making the air-core coil 33 by using the copper wire 41. Further, the gold wire is expensive and price of the air-core coil 33 is increased. Therefore, there is an effect of a reduction in parts cost by using cheap copper in a main body of the air-core coil 33, and removing the insulating film 43 from only a portion contributing to the junction and forming the gold plating 45 in this portion. Further, since the joining with the gold electrode 1a of the light emitting element 1 metallized by gold is performed, there is an effect able to increase joining strength by gold-plating the surface of the one-side end portion 39 of the first connecting portion 35. In addition, thermal load to the light emitting element 1 can be reduced in comparison with joining using solder, etc. so that the joining can be performed without deteriorating characteristics of the light emitting element 1. Further, there is also an advantage of easily making a work in a narrow place in comparison with the joining using solder, etc. Further, the joining can be performed by using a device and a jig (capillary 47, etc.) for wire bonding widely executed so that time and cost required in the joining can be reduced.

It is also considered that the joining is performed without removing the insulating film 43 similarly to the air-core coil 33 instead of the gold plating 45 with respect to the one-side end portion 39. In this case, dielectric breakdown of the insulating film 43 formed on the one-side end portion 39 is performed at a high temperature such as about 300° C., and the one-side end portion 39 is pressurized and thermocompression-bonded to the gold electrode 1a of the light emitting element 1 so that the one-side end portion 39 is joined to the gold electrode 1a. However, this method is not suitable in a case in which the light emitting element 1 is weak in high temperature, etc.

A method for joining the one-side end portion 39 of the first connecting portion 35 to the light emitting element 1 by resistance welding, soldering, etc. is also considered. However, in the case of the resistance welding, the thermal load to the light emitting element 1 is large, and there is a possibility that the deterioration of characteristics is caused. Further, in this method, the size of a jig for the joining is increased. Therefore, there is a possibility that it is difficult to perform the joining in a narrow range on an upper face of the light emitting element 1. In the case of the soldering, there is a fear that solder flows out in the vicinity of the one-side end portion 39. Therefore, there is a possibility that the solder is attached to a light emitting point of the light emitting element 1. For such reasons, the joining method using the resistance welding, the soldering, etc. is not appropriate as a method for joining the one-side end portion 39 to the light emitting element 1.

The constructing case of the filter portion 30 using one copper wire 41 has been explained in this embodiment mode. However, this invention is not limited to this case. Namely, it is sufficient to directly join the air-core coil 33 to the light emitting element 1 by the first connecting portion 35 without electrically joining the air-core coil 33 to any substrate on the way. Further, the case for constructing the air-core coil 33 and the first connecting portion 35 by the copper wire 41 has been explained. However, the air-core coil 33 and the first connecting portion 35 may be also constructed by any lead wire formed by an electroconductive material having hardness equal to that of copper. Further, the gold electrode 1a of the light emitting element 1 and the gold plating of the one-side end portion 39 are also examples of materials considered as optimum materials. Accordingly, a metallic electrode and a metallic film formed by another metal may be also used instead of gold if a similar role is fulfilled.

In the explanation of the embodiment mode of this invention, unillustrated drive ICs are arranged in the exterior of the package 9. However, this invention is not limited to this case. Namely, these drive ICs may be also included within the package 9.

In the explanation of this embodiment mode 1, portions different from those in the conventional optical element module are explained, and explanations of the same or corresponding portions are omitted.

Embodiment Mode 2

Figure 6:
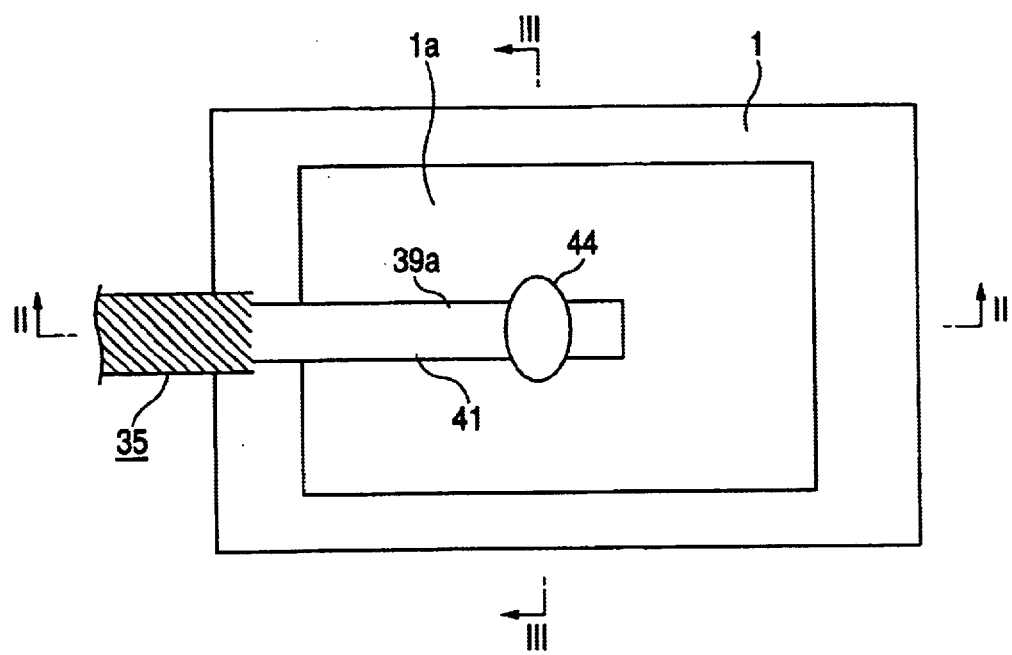
FIG. 6 is an enlarged view in which the joining portion of the light emitting element 1 and the first connecting portion 35 in FIG. 2 is seen from the top face.
Figure 7:
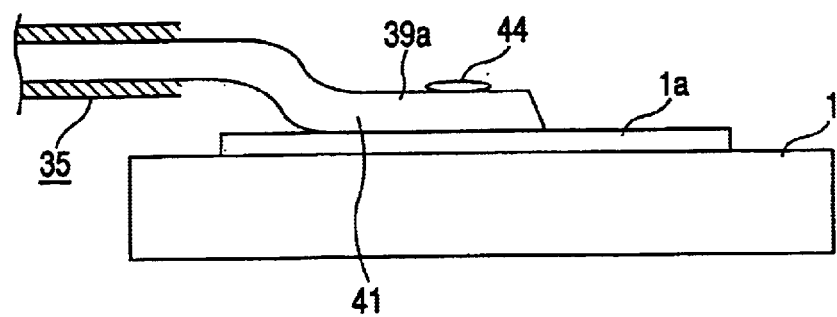
FIG. 7 is a sectional view seen from a II—II section of the joining portion shown in FIG. 6.
Figure 8:
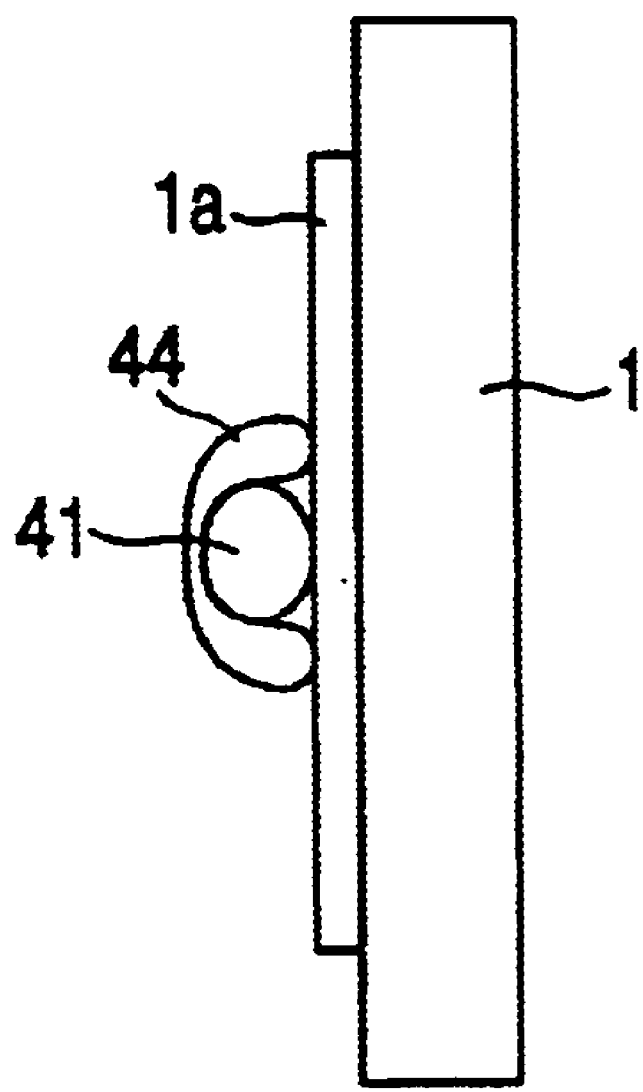
FIG. 8 is a sectional view seen from a III—III section of the joining portion shown in FIG. 6.

An embodiment mode 2 as a modified example of the embodiment mode 1 will next be explained. FIG. 6 is an enlarged view in which a joining portion of the light emitting element 1 and the first connecting portion 35 in FIG. 2 is seen from a top face. FIG. 7 is a sectional view seen from a II—II section of the joining portion shown in FIG. 6. FIG. 8 is a sectional view seen from a III—III section of the joining portion shown in FIG. 6. This embodiment mode 2 differs from the embodiment mode 1 only in a thermocompression bonding method of the first connecting portion 35 and the light emitting element 1, and the others points are similar to those in the embodiment mode 1.

In these figures, reference numeral 39a designates a one-side end portion of the first connecting portion 35. However, no surface of this one-side end portion 39a is gold-plated, but a copper wire 41 is exposed to this surface. Reference numeral 44 designates a gold bump as an example of the bump. The one-side end portion 39a is pressed and joined to the gold electrode 1a by this gold bump 44 in an exposure portion of the copper wire 41. The one-side end portion 39a and the gold electrode 1a can be also joined to each other by such pressing of the gold bump 44. In this case, the joining can be also performed by using a capillary 47, etc. As can be seen from FIG. 8, the copper wire 41 is more firmly joined to the gold electrode 1a by joining the gold bump 44 and the gold electrode 1a. The gold bump 44 and the gold electrode 1a are electrically conducted by joining the gold bump 44 and the gold electrode 1a to each other.

Embodiment Mode 3

Figure 9:
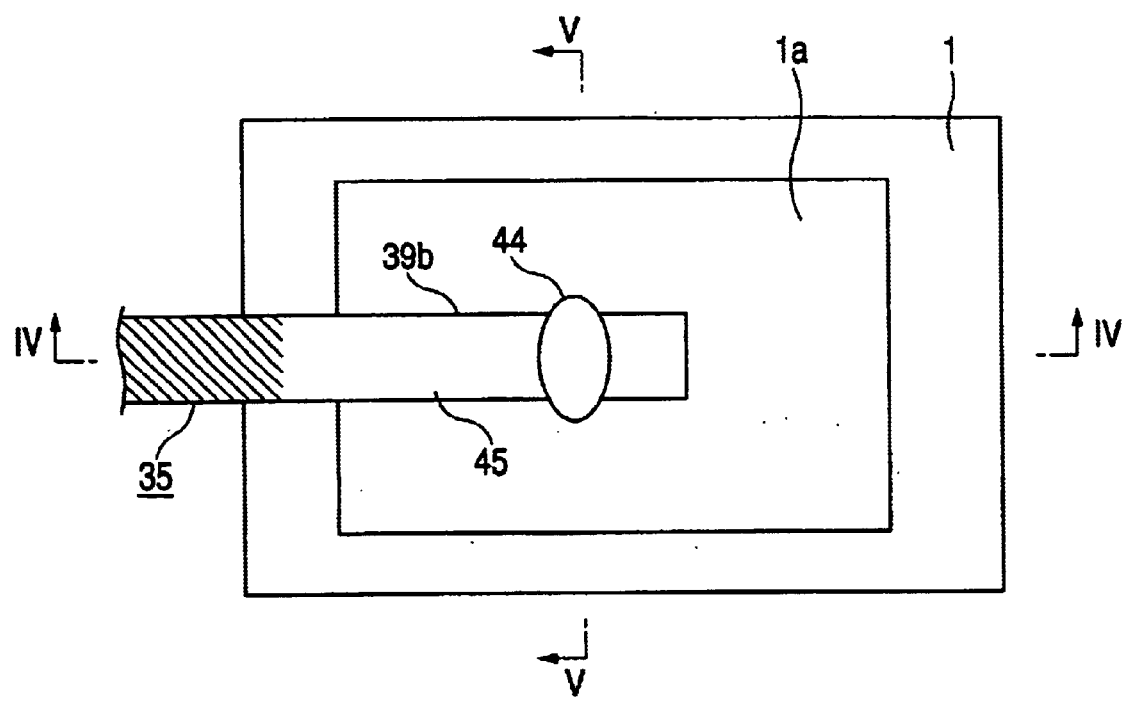
FIG. 9 is an enlarged view in which the joining portion of the light emitting element 1 and the first connecting portion 35 in FIG. 2 is seen from the top face.
Figure 10:
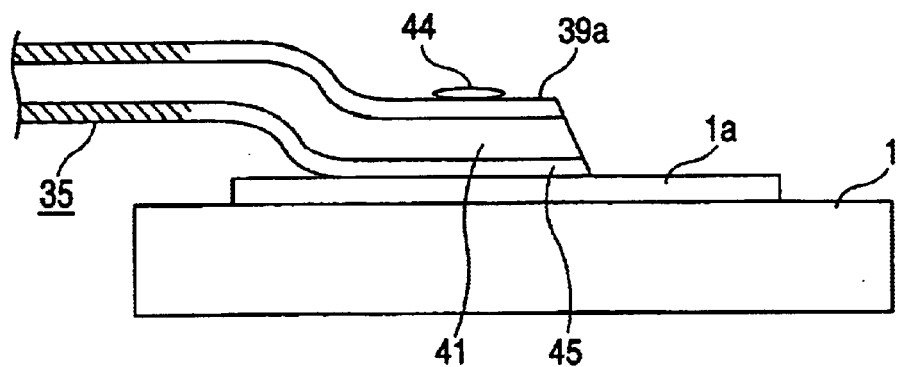
FIG. 10 is a sectional view seen from a IV—IV section of the joining portion shown in FIG. 9.
Figure 11:
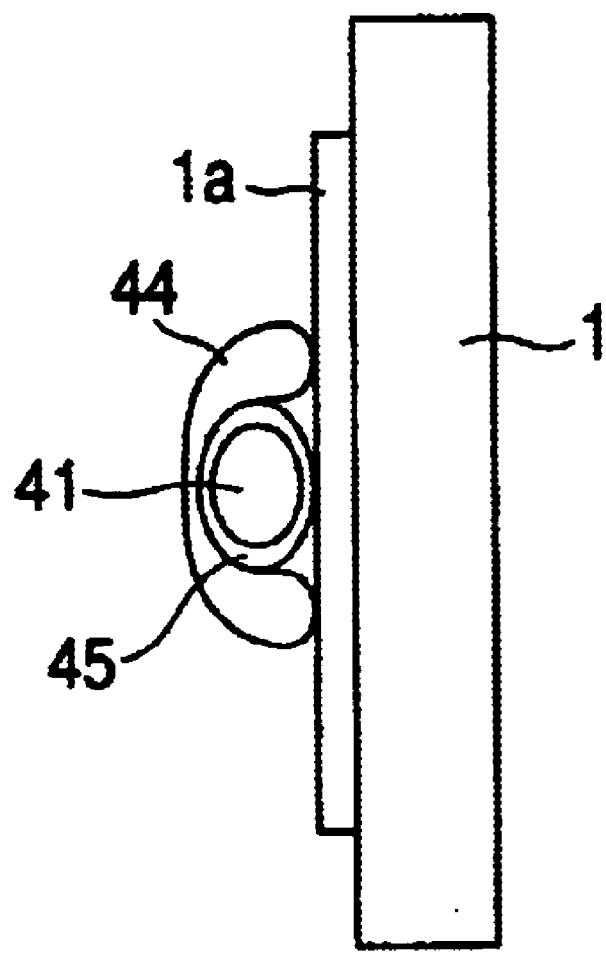
FIG. 11 is a sectional view seen from a V—V section of the joining portion shown in FIG. 9.

An embodiment mode 3 as a modified example of the embodiment mode 1 will next be explained. FIG. 9 is an enlarged view in which a joining portion of the light emitting element 1 and the first connecting portion 35 in FIG. 2 is seen from a top face. FIG. 10 is a sectional view seen from a IV—IV section of the joining portion shown in FIG. 9. FIG. 11 is a sectional view seen from a V—V section of the joining portion shown in FIG. 9. This embodiment mode 3 differs from the embodiment mode 1 only in a thermocompression bonding method of the first connecting portion 35 and the light emitting element 1, and the others points are similar to those in the embodiment mode 1.

In these figures, reference numeral 39b designates a one-side end portion of the first connecting portion 35, and gold-plating 45 is formed on the surface of this one-side end portion 39b. Reference numeral 44 designates a gold bump as an example of the bump. The one-side end portion 39b is pressed and joined to the gold electrode 1a by this gold bump 44 in a forming portion of the gold plating 45. Thus, the one-side end portion 39b and the gold electrode 1a can be also joined to each other by forming the gold plating 45 on the copper wire 41 and then further pressing the gold bump 44. In this case, the joining can be also performed by using a capillary, etc. As can be seen from FIG. 11, the gold plating 45 and the gold electrode 1a are also joined to each other in addition to the joining of the gold bump 44 and the gold electrode 1a. Therefore, the copper wire 41 is more firmly joined to the gold electrode 1a in comparison with the above embodiment mode 2. In addition to the joining between the gold bump 44 and the gold electrode 1a, the copper wire 41 is also electrically conducted to the gold electrode 1a by the joining of the gold plating 45 and the gold electrode 1a.

Embodiment Mode 4

Figure 12:
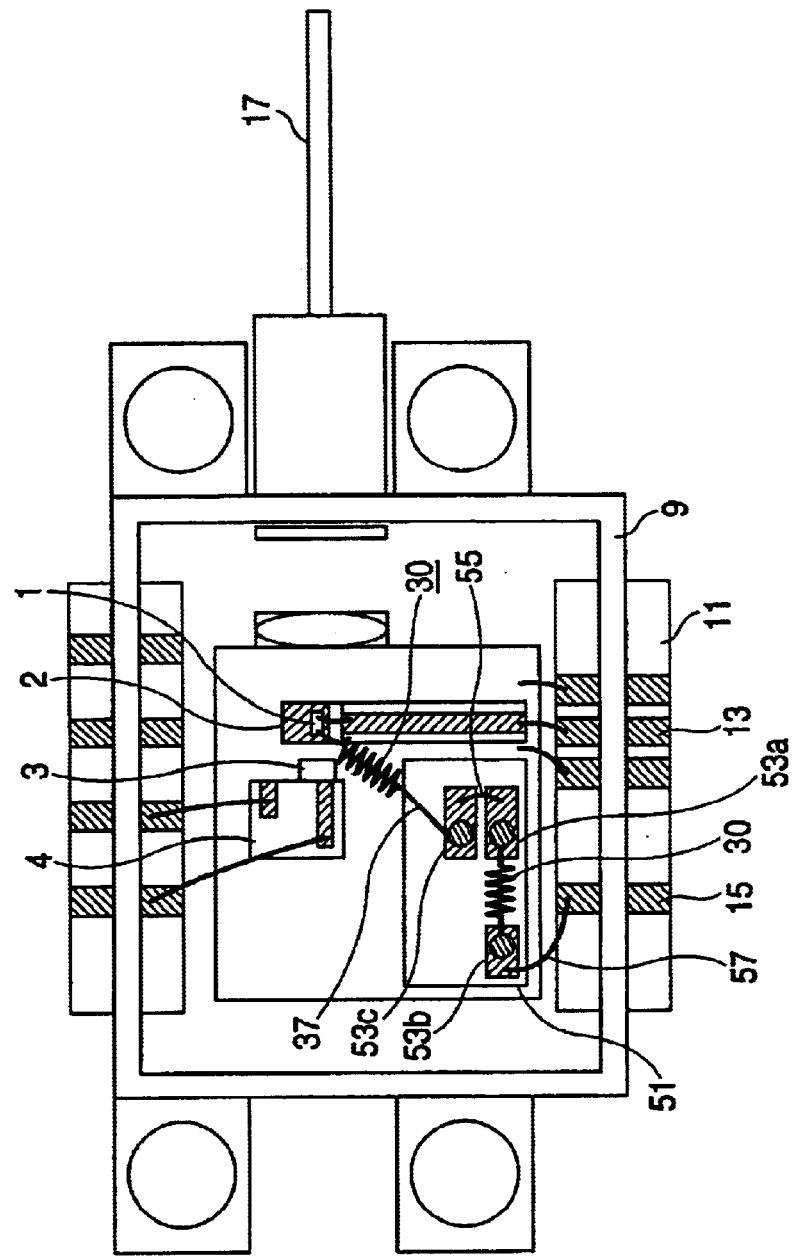
FIG. 12 is a top view showing the structure of an optical element module in accordance with an embodiment mode 4 of this invention.
Figure 13:
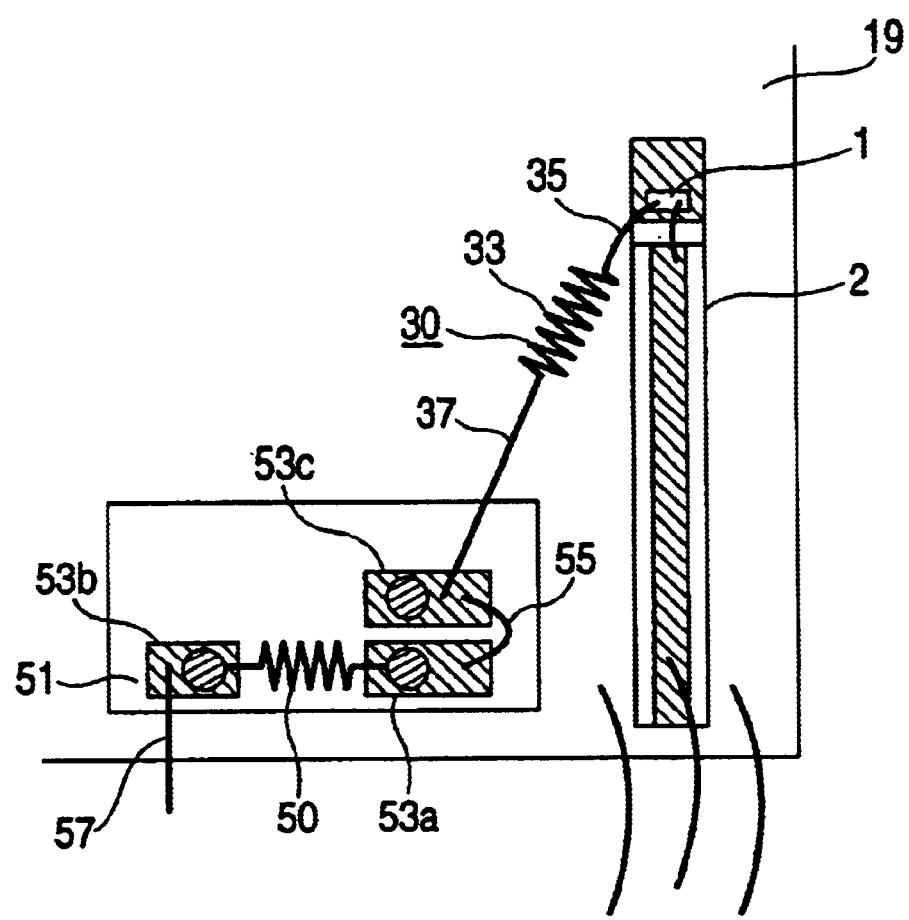
FIG. 13 is a top view showing a main portion of the optical element module shown in FIG. 12.

FIG. 12 is a top view showing the structure of an optical element module in accordance with an embodiment mode 4 of this invention. FIG. 13 is a top view showing a main portion of the optical element module shown in FIG. 12. In these figures, reference numerals 50 and 51 respectively designate a filter portion for low frequency, and a filter substrate for mounting this filter portion 50 for low frequency and manufactured by alumina. The filter portion 50 for low frequency may be constructed by an air-core coil, but may be also constructed by a chip inductor. Both ends of the filter portion 50 for low frequency are joined to the filter substrate 51 in solder joining portions 53a and 53b. On the other hand, in this embodiment mode, the filter portion 30 functions as a filter portion for high frequency. An end portion of a second connecting portion 37 of this filter portion 30 for high frequency is joined to the filter substrate 51 by a solder joining portion 53c. Namely, there is a case in which the second connecting portion is directly connected to a feed-through 11 as in the above embodiment mode, and there is also a case in which the second connecting portion is connected to the filter substrate 51, etc. as in this embodiment mode. Further, this solder joining portion 53c is electrically connected to the solder joining portion 53a by a third connecting portion 55. Further, the solder joining portion 53b is also electrically connected to an electrode 15 for bias by a fourth connecting portion 57. Namely, the filter portion 50 for low frequency is electrically connected in series to the air-core coil 33 of the filter portion 30 through the second connecting portion 37.

Here, the problem of resonance as a subject of this invention mainly depends on the length of a line path between the light emitting element 1 and the air-core coil 33 near the light emitting element 1. Accordingly, high frequency characteristics can be improved in comparison with the conventional case by dividing the filter portion into two portions for high and low frequencies, and directly connecting the first connecting portion 35 of the filter portion 30 for high frequency near the light emitting element 1 to the light emitting element 1 without electrically joining the first connecting portion 35 to any substrate on the way as in this embodiment mode. Here, "electrically" means that a mechanical connection may be also made. Namely, when the filter portion 30 is heavy in weight, there is a case in which the filter portion 30 is mechanically joined (held) to a base carrier 19, a light emitting element carrier 2, etc. by an adhesive, etc. In this case, the filter portion 30 is mechanically joined to the base carrier 19, the light emitting element carrier 2, etc. in the air-core coil 33, or the first connecting portion 35 and the second connecting portion 37.

In the explanation of this embodiment mode 4, portions different from those in the optical element module shown in the embodiment mode 1 are explained, and explanations of the same or corresponding portions are omitted. Further, in this embodiment mode 4, the above embodiment mode 2 or 3 can be also adopted with respect to the joining method of the first connecting portion 35 and the light emitting element 1.

Embodiment Mode 5

Figure 14:
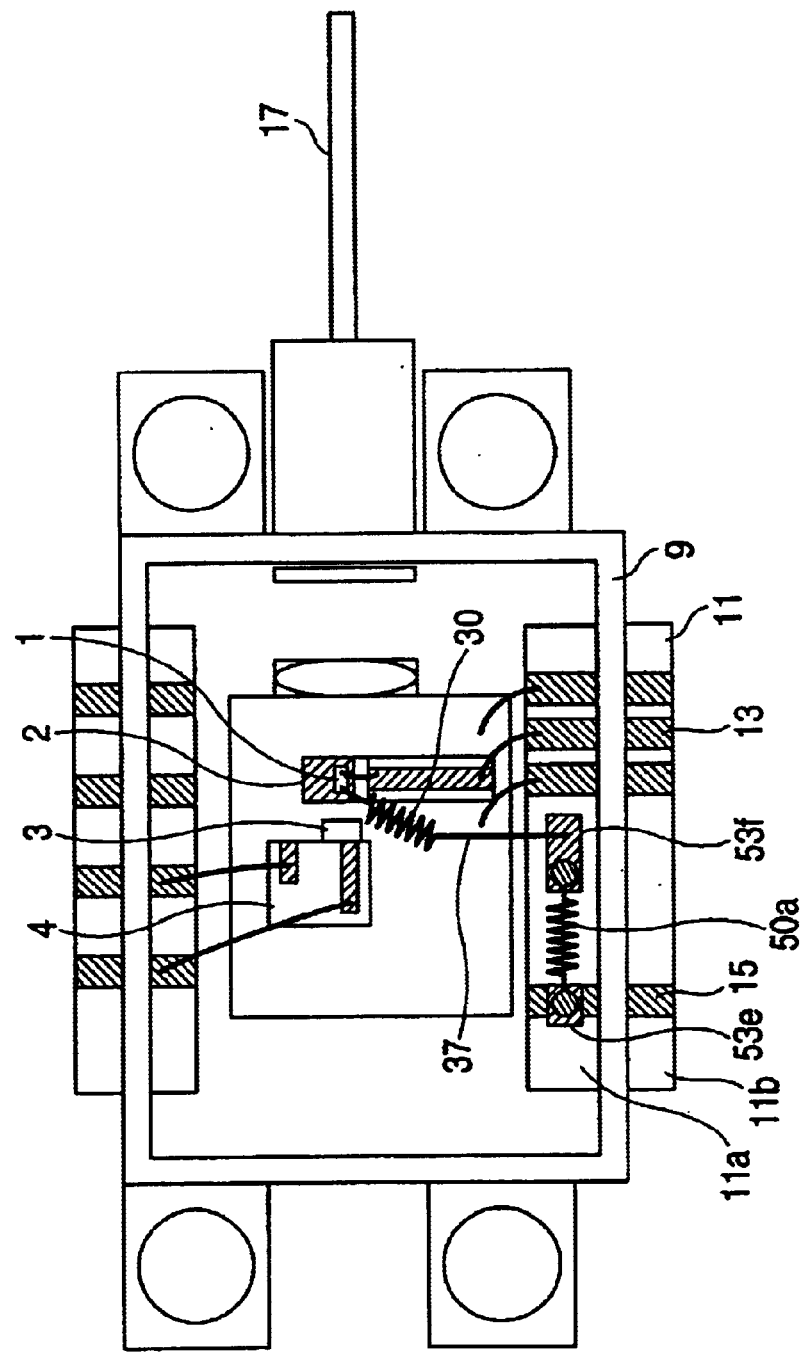
FIG. 14 is a top view showing the structure of an optical element module in accordance with an embodiment mode 5 of this invention.
Figure 15:
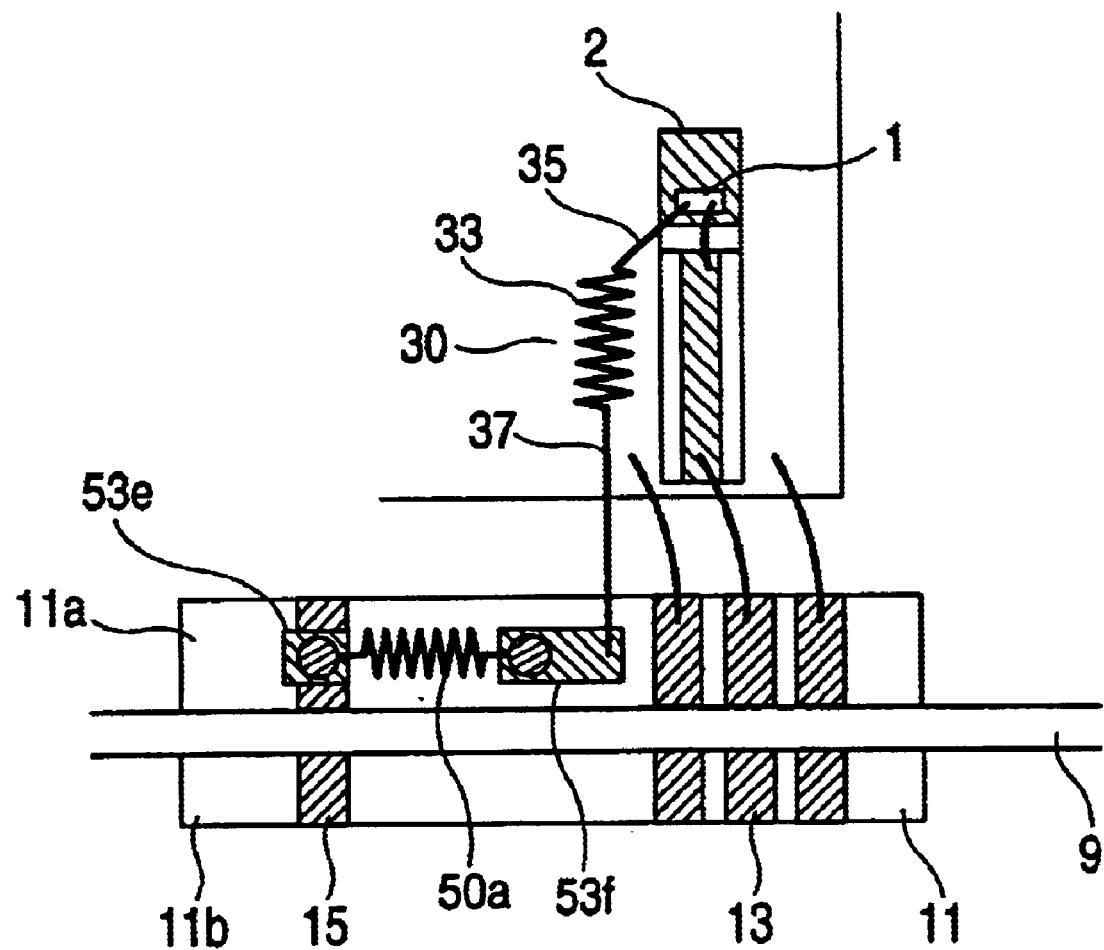
FIG. 15 is a top view showing a main portion of the optical element module shown in FIG. 14.

FIG. 14 is a top view showing the structure of an optical element module in accordance with an embodiment mode 5 of this invention. FIG. 15 is a top view showing a main portion of the optical element module shown in FIG. 14. In these figures, reference numeral 50a designates a filter portion for low frequency. This filter portion for low frequency may be constructed by an air-core coil, but may be also constructed by a chip inductor. This filter portion 50a for low frequency is arranged on a shelf portion 11a of a feed-through 11. Both ends of this filter portion 50a for low frequency are joined onto the shelf portion 11a by solder joining portions 53e and 53f. On the other hand, in this embodiment mode, a filter portion 30 functions as a filter portion for high frequency. An end portion of a second connecting portion 37 of this filter portion 30 for high frequency is joined to a portion near the solder joining portion 53f on the shelf portion 11a. Further, the solder joining portion 53e is connected to an electrode 15 for bias. Namely, the filter portion 50a for low frequency is electrically connected in series to the air-core coil 33 of the filter portion 30 through the second connecting portion 37.

Here, the problem of resonance as a subject of this invention mainly depends on the length of a line path between the light emitting element 1 and the air-core coil 33 near the light emitting element 1. Accordingly, high frequency characteristics can be improved in comparison with the conventional case by dividing the filter portion into two portions for high and low frequencies, and directly connecting the first connecting portion 35 of the filter portion 30 for high frequency near the light emitting element 1 to the light emitting element 1 without electrically joining the first connecting portion 35 to any substrate on the way as in this embodiment mode.

In this embodiment mode, the filter portion 50a for low frequency is arranged on the shelf portion 11a of the feed-through 11. Therefore, there is also an effect of being able to omit the filter substrate 51 in comparison with the embodiment mode 4.

In the explanation of this embodiment mode 4, portions different from those in the optical element module shown in the embodiment mode 1 are explained, and explanations of the same or corresponding portions are omitted. Further, in this embodiment mode 5, the above embodiment mode 2 or 3 can be also adopted with respect to the joining method of the first connecting portion 35 and the light emitting element 1.

Embodiment Mode 6

Figure 16:
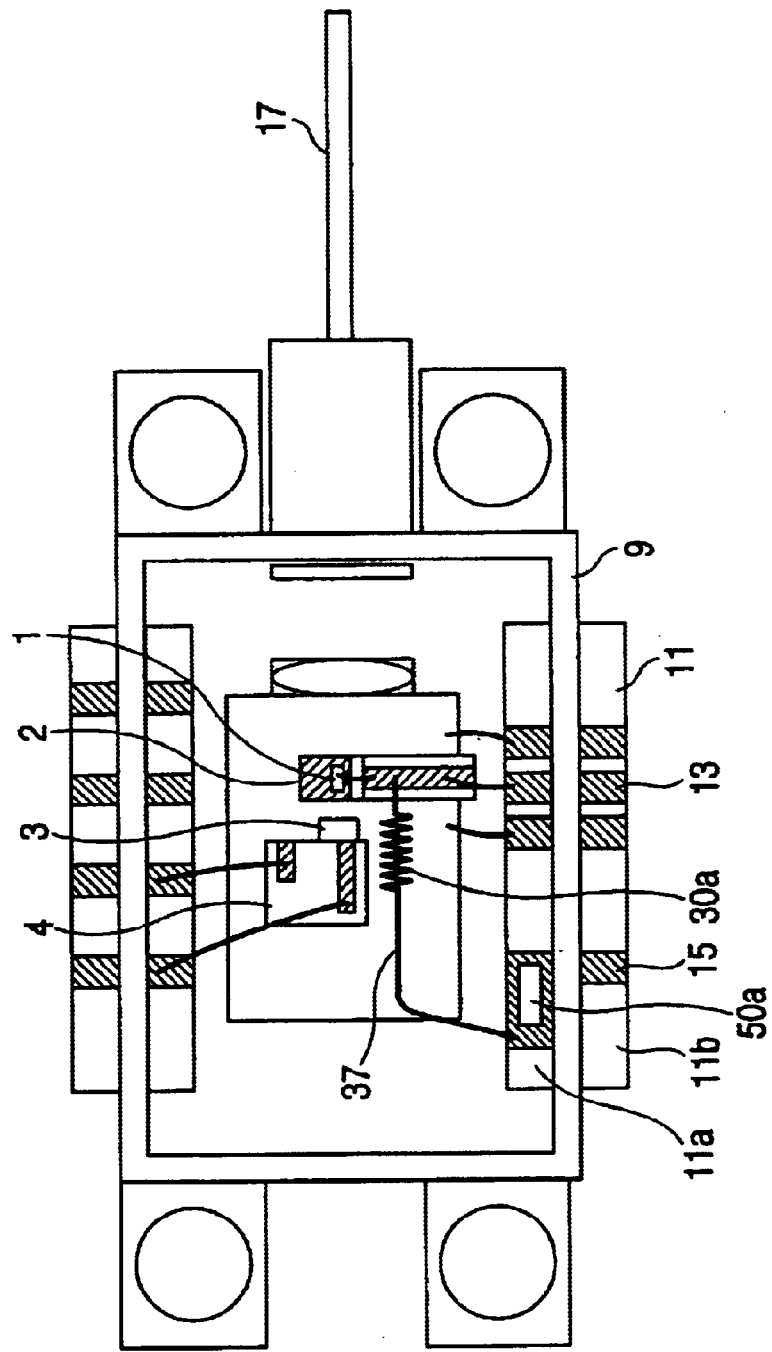
FIG. 16 is a top view showing the structure of an optical element module in accordance with an embodiment mode 6 of this invention.

FIG. 16 is a top view showing the structure of an optical element module in accordance with an embodiment mode 6 of this invention. In this figure, reference numeral 30a designates a filter portion used in one portion of a bias circuit for supplying a bias electric current from a power source to the light emitting element 1. One end of this filter portion 30a is connected to a light emitting element carrier 2 as a substrate mounting the light emitting element 1 thereto, and the other end is connected to an electrode 15 for bias on the surface of a shelf portion 11a of the feed-through 11. Reference numeral 50a designates a filter portion for low frequency connected to this electrode 15 for bias, but a chip inductor is used here as this filter portion 50a for low frequency. This filter portion 50a for low frequency can be also omitted.

Namely, in the optical element module in accordance with this embodiment mode 1, the filter portion 30a is laid and arranged between the light emitting element carrier 2 and the feed-through 11. Therefore, there is also no conventionally existing substrate for mounting the filter portion 30a in this embodiment mode.

The construction of the filter portion 30a will next be explained in detail by using FIGS. 17 and 18.

Figure 17:
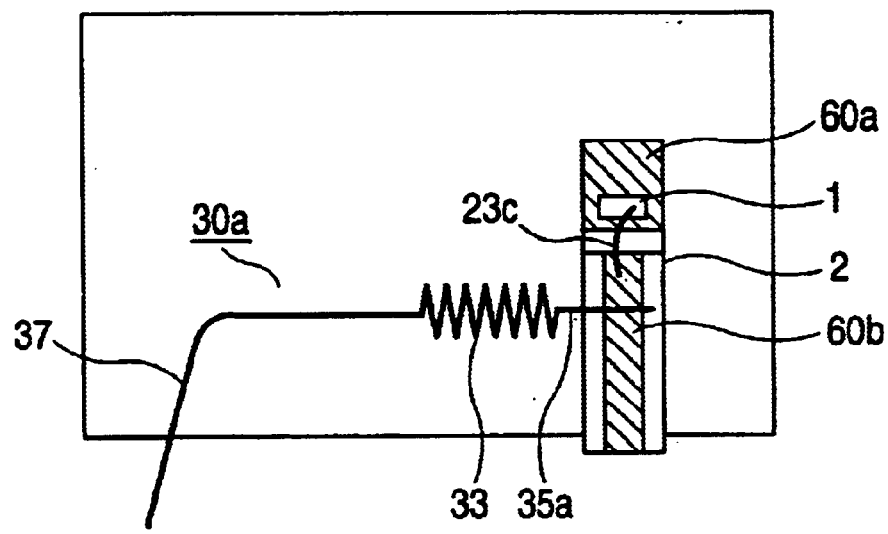
FIG. 17 is a top view of a main portion of the optical element module in accordance with the embodiment mode 6 shown in FIG. 16.
Figure 18:
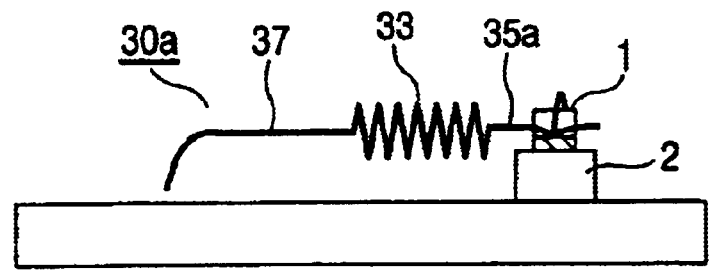
FIG. 18 is a side view of the main portion shown in FIG. 16.

FIG. 17 is a top view of a main portion of the optical element module in accordance with the embodiment mode 6 shown in FIG. 16. FIG. 18 is a side view of the main portion shown in FIG. 16. In these figures, each of reference numerals 60a and 60b designates a gold pattern as a metallic pattern formed on the surface of the light emitting element carrier 2. The light emitting element 1 is placed on an upper face of this gold pattern 60a. The light emitting element 1 and the gold pattern 60b are connected to each other by a bonding wire 23c. Details of a microstrip line path, etc. are similar to those in FIGS. 2 and 3.

Reference numerals 33 and 35a respectively designate an air-core coil corresponding to a coil portion as a central portion of the filter portion 30a, and a first connecting portion extending from one end of this air-core coil 33. An end portion of this first connecting portion 35a is joined to the gold pattern 60b by thermocompression bonding. Reference numeral 37 designates a second connecting portion extending from the other end of the air-core coil 33. As mentioned above, there is no conventionally existing filter substrate 6 in this embodiment mode. Therefore, the first connecting portion 35a directly connects the air-core coil 33 and the light emitting element carrier 2 as a substrate mounting the light emitting element 1 thereto without electrically joining the first connecting portion 35a to any substrate on the way. Similarly, the second connecting portion 37 directly connects the air-core coil 33 and the electrode 15 for bias arranged on the surface of the shelf portion 11a of the feed-through 11 without electrically joining the second connecting portion 37 to any substrate on the way.

The length of a line path from one end of the air-core coil 33 to the light emitting element 1, i.e., the total of a length of the first connecting portion 35a and lengths of the gold pattern 60b and the bonding wire 23c is shorter than ¼ of a wavelength corresponding to an upper limit frequency of a high frequency signal supplied to the light emitting element 1. Namely, this length is set to 1 mm or less in consideration of a high speed of 10 Gbps or more.

Figure 19:
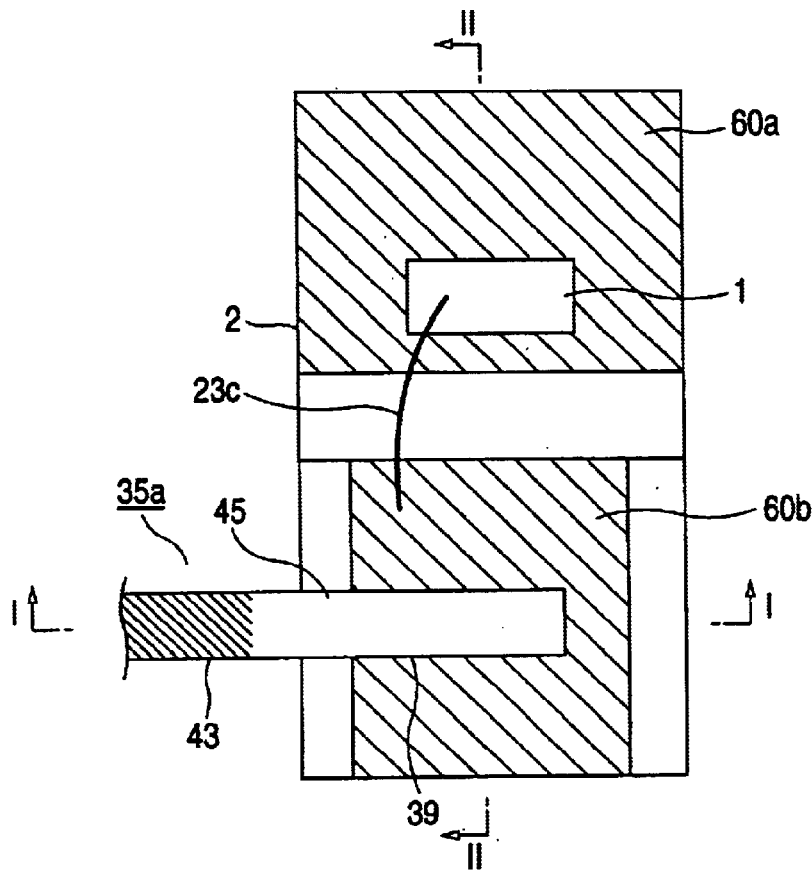
FIG. 19 is an enlarged view in which a joining portion of a light emitting element carrier 2 and a first connecting portion 35a in FIG. 17 is seen from a top face.
Figure 20:
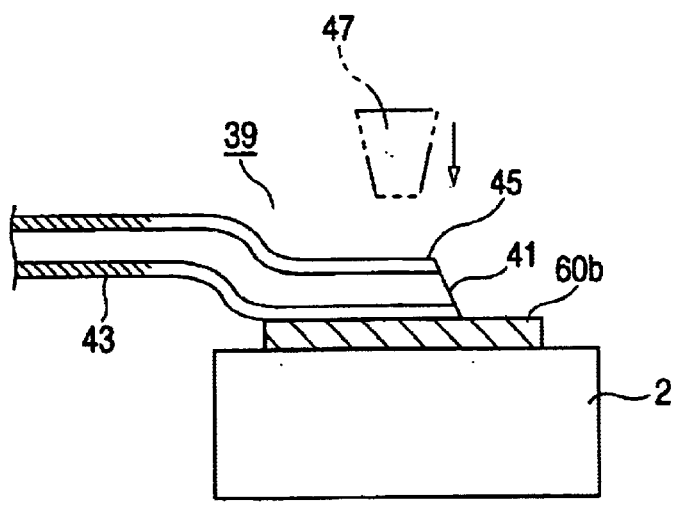
FIG. 20 is a sectional view in a I—I section of the joining portion shown in FIG. 19.
Figure 21:
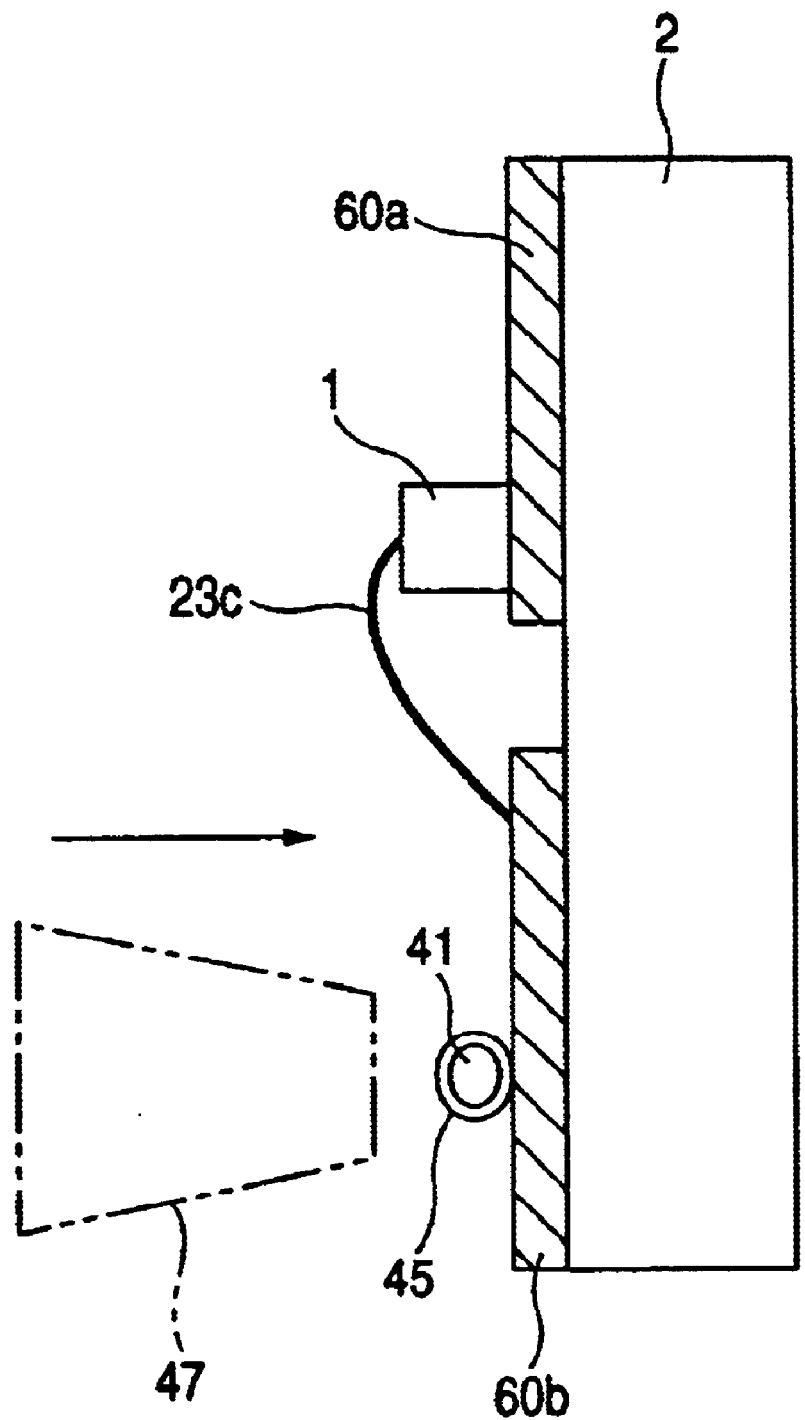
FIG. 21 is a sectional view in a II—II section of the joining portion shown in FIG. 19.

Further, the relation of the first connecting portion 35a and the light emitting element carrier 2 will be explained by using FIGS. 19 to 21. FIG. 19 is an enlarged view in which a joining portion of the light emitting element carrier 2 and the first connecting portion 35a in FIG. 17 is seen from a top face. FIG. 20 is a sectional view in a I—I section of the joining portion shown in FIG. 19. FIG. 21 is a sectional view in a II—II section of the joining portion shown in FIG. 19.

In these figures, reference numeral 39 designates a one-side end portion of the first connecting portion 35a, and this one-side end portion 39 is thermocompression-bonded to the gold pattern 60b. Reference numeral 41 designates a copper wire communicated over an entire length (the first connecting portion 35a, the air-core coil 33 and the second connecting portion 37) of the filter portion 30 including this one-side end portion 39 without a cutting face. This copper wire 41 is coated with an insulating film 43. The insulating film 43 is formed in the air-core coil 33, one portion of the first connecting portion 35a and one portion of the second connecting portion 37. Reference numeral 45 designates gold plating as a metallic film formed in the copper wire 41 in a portion of the one-side end portion 39. Namely, the filter portion 30a has a construction having the air-core coil 33 between the first connecting portion 35a and the second connecting portion 37 by forming a spiral in an intermediate portion of the one copper wire 41 coated with the insulating film 43. Further, this filter portion 30a is constructed by removing at least the insulating film 43 on the surface of the one-side end portion 39 of the first connecting portion 35a, and forming the gold-plating 45 on the copper wire 41.

On the other hand, the one-side end portion 39 having the gold plating 45 is joined to the gold pattern 60b by thermocompression bonding using an instrument, etc. widely used as a device and a jig for wire bonding such as a capillary 47. The air-core coil 33 and the light emitting element carrier 2 are connected to each other by the first connecting portion 35a by this joining. Temperature of the thermocompression bonding is set to about 150° C., and a supersonic wave can be also used together in the joining.

Since the optical element module in this embodiment mode is constructed as mentioned above, it is possible to omit the solder joining portion 22b, the bonding wire 23b, etc. conventionally arranged. Therefore, the light emitting element carrier 2 and the air-core coil 33 can be directly joined to each other by the first connecting portion 35a, and the distance between both the light emitting element carrier 2 and the air-core coil 33 can be shortened. As a result, it is possible to obtain an optical element module having preferable high frequency characteristics.

The filter portion 30 in this embodiment mode is formed by one copper wire 41 over the entire length of this filter portion 30, and is constructed by forming gold-plating 45 on the surface of the one-side end portion 39 of the first connecting portion 35a. This is because it is considered that, when all of the first connecting portion 35a is constructed by a gold wire, the first connecting portion 35a is too soft to form the air-core coil 33. Therefore, there is an effect of easily making the air-core coil 33 by using the copper wire 41. Further, the gold wire is expensive and price of the air-core coil 33 is increased. Therefore, there is an effect of a reduction in parts cost by using cheap copper in a main body of the air-core coil 33, and removing the insulating film 43 from only a portion contributing to the junction and forming the gold plating 45 in this portion. Further, since the joining with the gold pattern 60b of the light emitting element carrier 2 metallized by gold is performed, there is an effect of being able to increase joining strength by forming the gold-plating 45 on the surface of the one-side end portion 39 of the first connecting portion 35a. Further, no one-side end portion 39 is joined to the light emitting element 1 in this embodiment mode. Therefore, thermal load to the light emitting element 1 can be reduced so that the joining can be performed without further deteriorating characteristics of the light emitting element 1. Further, there is an advantage of easily making a work in a narrow place in comparison with the joining using solder, etc. Further, the joining can be performed by using a device and a jig (capillary 47, etc.) for wire bonding widely executed so that time and cost required in the joining can be reduced.

In this embodiment mode 6, the case for joining the one-side end portion 39 of the first connecting portion 35a to the gold pattern 60b connected to the light emitting element 1 by the bonding wire 23c has been explained. However, this invention is not limited to this case. Namely, if the gold pattern is arranged on the light emitting element carrier 2, the one-side end portion 39 may be also joined to the gold pattern 60a placing the light emitting element 1 thereon. Further, the pattern is not limited to gold, but may be also set to aluminum.

In the explanation of this embodiment mode 6, portions different from those in the optical element module of the embodiment mode 1 are explained, and explanations of the same or corresponding portions are omitted.

In addition, similar to the embodiment mode 1, a filter portion 50 for low frequency is also used and variations of constructions as shown in the embodiment modes 4 and 5 can be made in this embodiment mode. Namely, similar to FIG. 12, the filter portion 50 for low frequency is mounted to a filter substrate 51, and an end portion of the second connecting portion 37 of the filter portion 30 can be electrically connected to one end of this filter portion 50 for low frequency. In accordance with such a construction, the filter portion 50 for low frequency is electrically connected in series to the air-core coil 33 of the filter portion 30 through the second connecting portion 37.

Further, as shown in FIG. 14, the filter portion 50a for low frequency is arranged in a shelf portion 11a of the feedthrough 11, and one end of this filter portion 50a for low frequency and an end portion of the second connecting portion 37 can be also connected to each other. In accordance with such a construction, the filter portion 50a for low frequency is electrically connected in series to the air-core coil 33 through the second connecting portion 37.

Embodiment Mode 7

Figure 22:
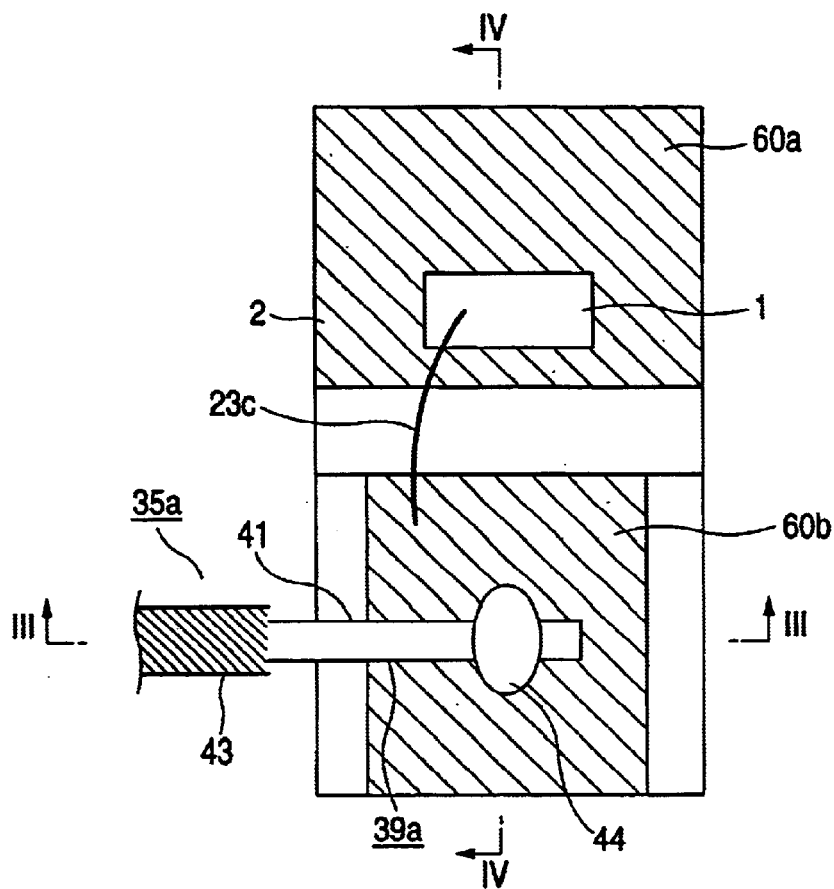
FIG. 22 is an enlarged view in which the joining portion of the light emitting element carrier 2 and the first connecting portion 35a in FIG. 17 is seen from the top face.
Figure 23:
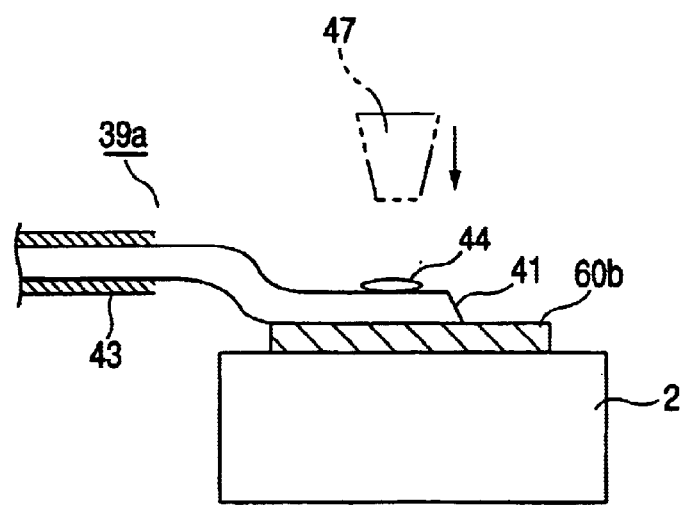
FIG. 23 is a sectional view seen from a III—III section of the joining portion shown in FIG. 22.
Figure 24:
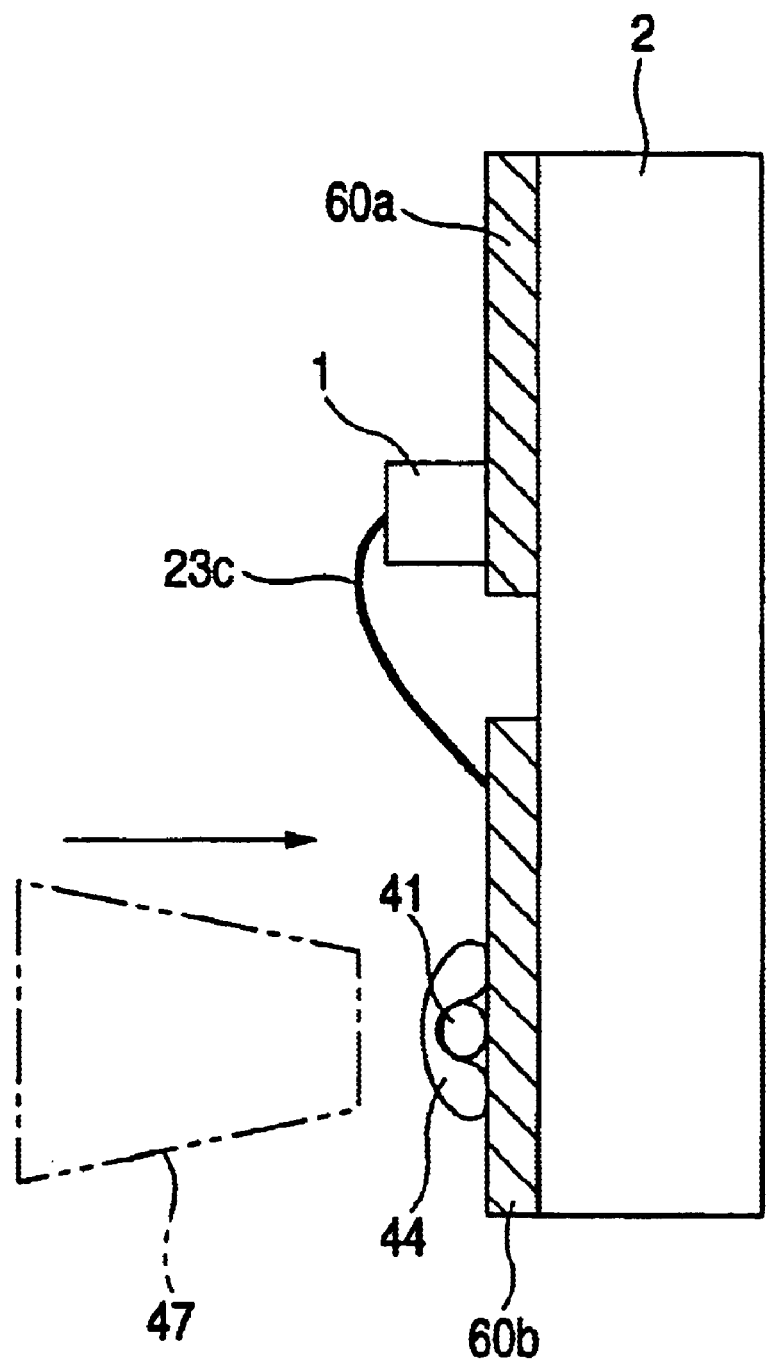
FIG. 24 is a sectional view seen from a IV—IV section of the joining portion shown in FIG. 22.

An embodiment mode 7 as a modified example of the embodiment mode 6 will next be explained. FIG. 22 is an enlarged view in which a joining portion of the light emitting element carrier 2 and the first connecting portion 35a in FIG. 17 is seen from a top face. FIG. 23 is a sectional view seen from a III—III section of the joining portion shown in FIG. 22. FIG. 24 is a sectional view seen from a IV—IV section of the joining portion shown in FIG. 22. This embodiment mode 7 differs from the embodiment mode 6 only in a thermocompression bonding method of the first connecting portion 35a and the light emitting element carrier 2, and the other points are similar to those in the embodiment mode 6.

In these figures, reference numeral 39a designates a one-side end portion of the first connecting portion 35a. However, no surface of this one-side end portion 39a is gold-plated, but a copper wire 41 is exposed to this surface. Reference numeral 44 designates a gold bump as an example of the bump. The one-side end portion 39a is pressed and joined to a gold pattern 60b by this gold bump 44 in an exposure portion of the copper wire 41. The one-side end portion 39a and the gold pattern 60b can be also joined to each other by such pressing of the gold bump 44. In this case, the joining can be also performed by using a capillary, etc. As can be seen from FIG. 24, the copper wire 41 is more firmly joined to the gold pattern 60b by joining the gold bump 44 and the gold pattern 60b. The gold bump 44 and the gold pattern 60b are also electrically conducted by joining the gold bump 44 and the gold pattern 60b to each other.

Embodiment Mode 8

Figure 25:
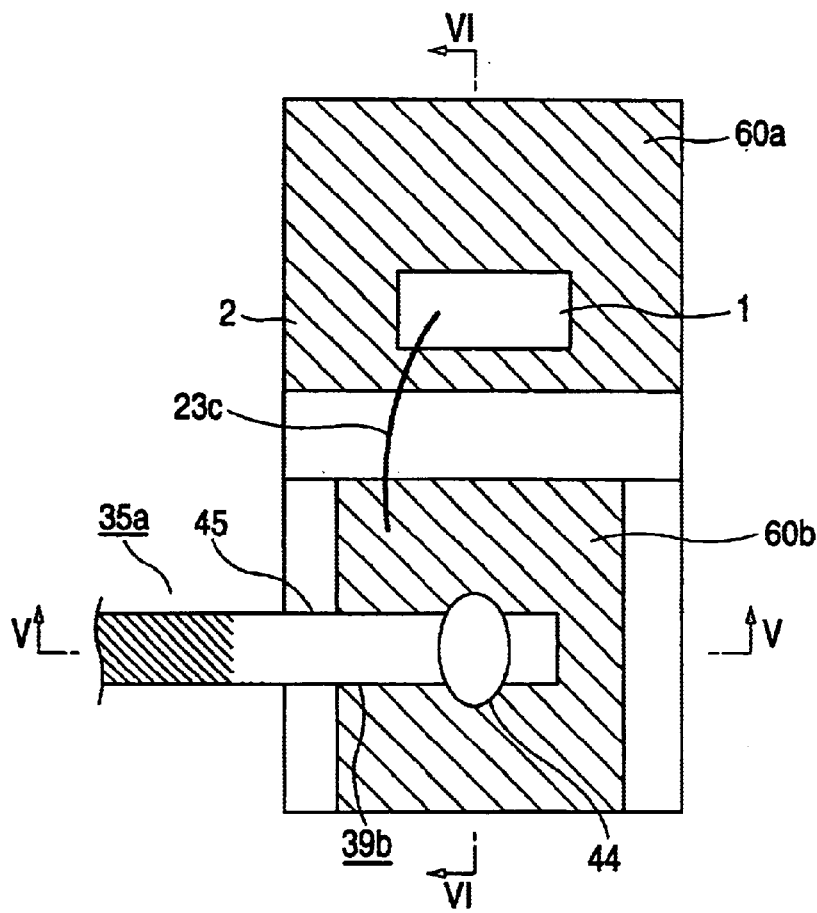
FIG. 25 is an enlarged view in which the joining portion of the light emitting element carrier 2 and the first connecting portion 35a in FIG. 17 is seen from the top face.
Figure 26:
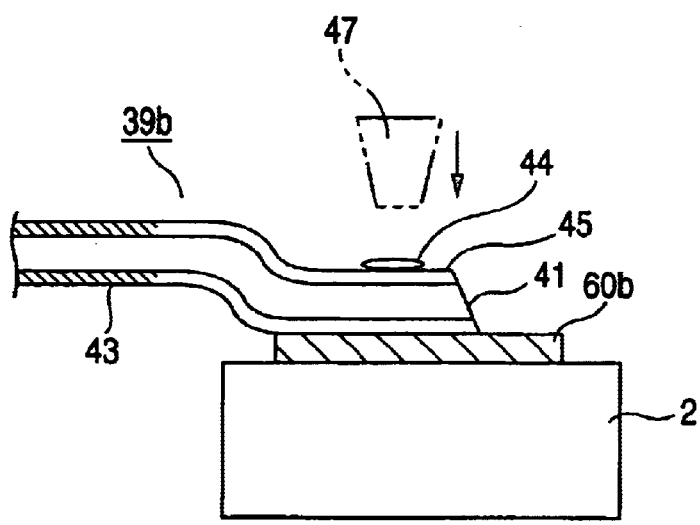
FIG. 26 is a sectional view seen from a V—V section of the joining portion shown in FIG. 25.
Figure 27:
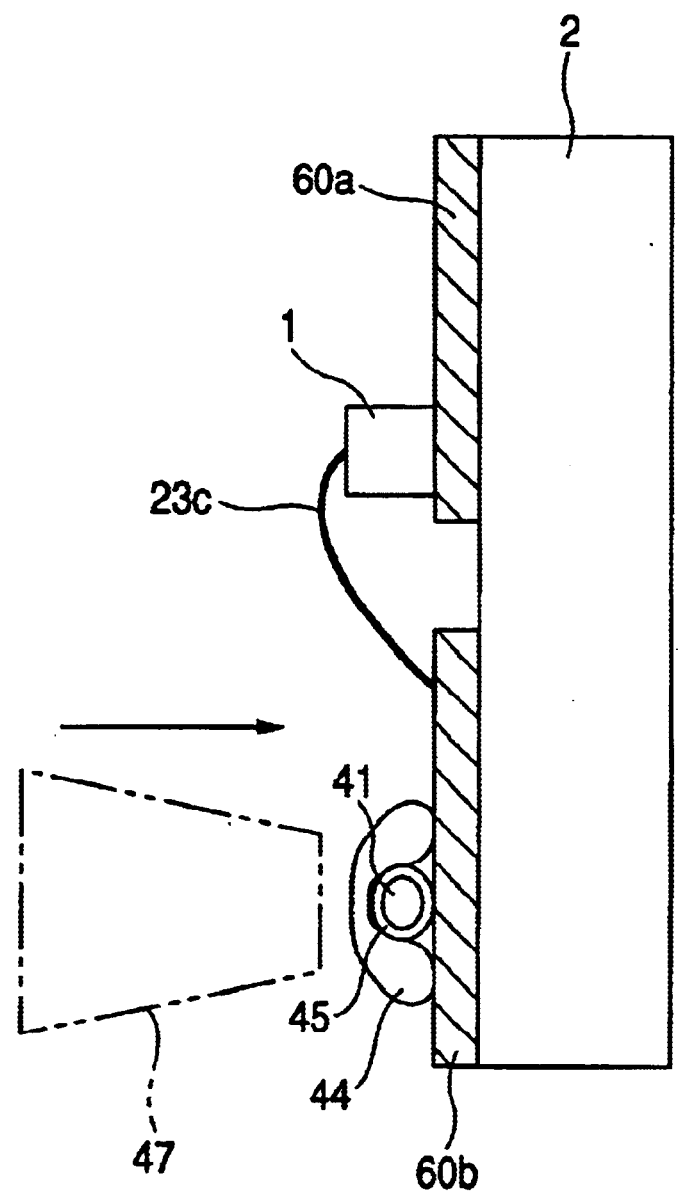
FIG. 27 is a sectional view seen from a VI—VI section of the joining portion shown in FIG. 25.

An embodiment mode 8 as a modified example of the embodiment mode 6 will next be explained. FIG. 25 is an enlarged view in which the joining portion of the light emitting element carrier 2 and the first connecting portion 35a in FIG. 17 is seen from the top face. FIG. 26 is a sectional view seen from a V—V section of the joining portion shown in FIG. 25. FIG. 27 is a sectional view seen from a VI—VI section of the joining portion shown in FIG. 25. This embodiment mode 8 differs from the embodiment mode 6 only in a thermocompression bonding method of the first connecting portion 35a and the light emitting element carrier 2, and the other points are similar to those in the embodiment mode 6.

In these figures, reference numeral 39b designates a one-side end portion of the first connecting portion 35a, and gold-plating 45 is formed on the surface of this one-side end portion 39b. Reference numeral 44 designates a gold bump as an example of the bump. The one-side end portion 39b is pressed and joined to the gold pattern 60b by this gold bump 44 in a forming portion of the gold plating 45. Thus, the one-side end portion 39b and the gold pattern 60b can be also joined to each other by forming the gold plating 45 on the copper wire 41 and then further pressing the gold bump 44. In this case, the joining can be also performed by using a capillary, etc. As can be seen from FIG. 27, the gold plating 45 and the gold pattern 60b are also joined to each other in addition to the joining of the gold bump 44 and the gold pattern 60b. Therefore, the copper wire 41 is more firmly joined to the gold pattern 60b in comparison with the above embodiment mode 7. In addition to the joining between the gold bump 44 and the gold pattern 60b, the copper wire 41 is electrically conducted to the gold pattern 60b by the joining of the gold plating 45 and the gold pattern 60b.

An optical element module in this invention has a light emitting element, and a filter portion used in one portion of a bias circuit for supplying a bias electric current from a power source to this light emitting element, wherein this filter portion has a coil portion and a first connecting portion extending from one end of this coil portion, and the first connecting portion directly connects the coil portion and the light emitting element without electrically joining the first connecting portion to any substrate on the way. Accordingly, the length of a line path between the light emitting element and the coil is shortened and preferable high frequency characteristics can be obtained.

Further, an optical element module in this invention has a light emitting element, a substrate mounting this light emitting element thereto, and a filter portion used in one portion of a bias circuit for supplying a bias electric current from a power source to the light emitting element, wherein this filter portion has a coil portion and a first connecting portion extending from one end of this coil portion, and the first connecting portion directly connects the coil portion and the substrate mounting the light emitting element thereto without electrically joining the first connecting portion to any substrate on the way. Accordingly, the length of a line path between the light emitting element and the coil is shortened and preferable high frequency characteristics can be obtained.

What is claimed is:

1. An optical element module comprising:
    a light emitting element; and
    a filter portion used in one portion of a bias circuit for supplying a bias electric current from a power source to this light emitting element;
    wherein this filter portion has a coil portion and a first connecting portion extending from one end of this coil portion; and
    said first connecting portion directly connects said coil portion and said light emitting element without electrically joining the first connecting portion to any substrate on the way.

2. An optical element module according to claim 1, wherein said coil portion and said light emitting element are connected to each other by thermocompression-bonding a one-side end portion of the first connecting portion to the light emitting element.

3. An optical element module according to claim 1, wherein the light emitting element has a metallic electrode on its surface,
    a one-side end portion of the first connecting portion is constructed by forming a metallic film on a lead wire, and
    said coil portion and said light emitting element are connected to each other by joining the one-side end portion having said metallic film to said metallic electrode.

4. An optical element module according to claim 1, wherein the light emitting element has a metallic electrode on its surface, and
    the coil portion and said light emitting element are connected to each other by fixing a one-side end portion of the first connecting portion to this metallic electrode by a bump.

5. An optical element module according to claim 4, wherein the one-side end portion of the first connecting portion is constructed by forming a metallic film on a lead wire.

6. An optical element module according to claim 1, wherein the first connecting portion has a length shorter than ¼ of a wavelength corresponding to an upper limit frequency of a high frequency signal supplied to the light emitting element.

7. An optical element module according to claim 1, wherein the first connecting portion has a length of 1 mm or less.

8. An optical element module according to claim 1, wherein the light emitting element has a gold electrode on its surface,
    the filter portion is constructed by one copper wire, and an insulating film is formed on the coil portion, and a gold film is formed on a one-side end portion of the first connecting portion, and
    said coil portion and said light emitting element are connected to each other by joining the one-side end portion having this gold film to the gold electrode of said light emitting element.

9. An optical element module comprising:
    a package;
    a feed-through for electrically conducting the interior and the exterior of this package, and having a shelf portion projected to said interior;
    a light emitting element included within said package; and
    a filter portion used in one portion of a bias circuit for supplying a bias electric current from a power source to said light emitting element;
    wherein this filter portion has a coil portion and a first connecting portion extending from one end of this coil portion, and also has a second connecting portion extending from the other end of said coil portion;
    said first connecting portion directly connects said coil portion and said light emitting element without electrically joining the first connecting portion to any substrate on the way; and
    said second connecting portion directly connects the other end of said coil portion and the shelf portion of said feed-through without electrically joining the second connecting portion to any substrate on the way.

10. An optical element module according to claim 9, wherein a filter portion for low frequency is arranged in the shelf portion of the feed-through, and is electrically connected in series to the coil through the second connecting portion.

11. An optical element module comprising:

a light emitting element;

a substrate mounting this light emitting element thereto; and a filter portion used in one portion of a bias circuit for supplying a bias electric current from a power source to said light emitting element;

wherein this filter portion has a coil portion and a first connecting portion extending from one end of this coil portion; and said first connecting portion directly connects said coil portion and said substrate mounting the light emitting element thereto without electrically joining the first connecting portion to any substrate on the way.

12. An optical element module according to claim 11, wherein said coil portion and said substrate mounting the light emitting element thereto are connected to each other by thermocompression-bonding a one-side end portion of the first connecting portion to the substrate mounting the light emitting element thereto.

13. An optical element module according to claim 11, wherein the substrate mounting the light emitting element thereto has a metallic pattern on its surface, a one-side end portion of the first connecting portion is constructed by forming a metallic film on a lead wire, and said coil portion and said substrate mounting the light emitting element thereto are connected to each other by joining the one-side end portion having said metallic film to said metallic pattern.

14. An optical element module according to claim 11, wherein the substrate mounting the light emitting element thereto has a metallic pattern on its surface, and the coil portion and said substrate mounting the light emitting element thereto are connected to each other by fixing a one-side end portion of the first connecting portion to this metallic pattern by a bump.

15. An optical element module according to claim 14, wherein the one-side end portion of the first connecting portion is constructed by forming a metallic film on a lead wire.

16. An optical element module according to claim 11, wherein the length of a line path from one end of the coil portion to the light emitting element is shorter than ¼ of a wavelength corresponding to an upper limit frequency of a high frequency signal supplied to said light emitting element.

17. An optical element module according to claim 11, wherein the length of a line path from one end of the coil portion to the light emitting element is set to 1 mm or less.

18. An optical element module according to claim 11, wherein the substrate mounting the light emitting element thereto has a gold pattern constructed by gold on its surface, the filter portion is constructed by one copper wire, and an insulating film is formed on the coil portion, and a gold film is formed on a one-side end portion of the first connecting portion, and said coil portion and said substrate mounting the light emitting element thereto are connected to each other by joining the one-side end portion having this gold film to said gold pattern.

19. An optical element module comprising:

a package;

a feed-through for electrically conducting the interior and the exterior of this package, and having a shelf portion projected to said interior;

a light emitting element included within said package;

a substrate mounting this light emitting element thereto; and a filter portion used in one portion of a bias circuit for supplying a bias electric current from a power source to said light emitting element;

wherein this filter portion has a coil portion and a first connecting portion extending from one end of this coil portion, and also has a second connecting portion extending from the other end of said coil portion;

said first connecting portion directly connects said coil portion and said substrate mounting the light emitting element thereto without electrically joining the first connecting portion to any substrate on the way; and said second connecting portion directly connects the other end of said coil portion and the shelf portion of said feed-through without electrically joining the second connecting portion to any substrate on the way.

20. An optical element module according to claim 19, wherein a filter portion for low frequency is arranged in the shelf portion of the feed-through, and is electrically connected in series to the coil through the second connecting portion.

* * * * *